United States Patent
Kaneko et al.

(10) Patent No.: US 12,527,163 B2
(45) Date of Patent: Jan. 13, 2026

(54) METHOD FOR PRODUCING LIGHT-EMITTING ELEMENTS

(71) Applicant: CENTRAL GLASS COMPANY, LIMITED, Ube (JP)

(72) Inventors: Yuzuru Kaneko, Kawagoe (JP); Yuta Sakaida, Kawagoe (JP); Keiko Sasaki, Kawagoe (JP); Asuka Sano, Kawagoe (JP)

(73) Assignee: CENTRAL GLASS COMPANY, LIMITED, Yamaguchi (JP)

( * ) Notice: Subject to any disclaimer, the term of this patent is extended or adjusted under 35 U.S.C. 154(b) by 553 days.

(21) Appl. No.: 17/926,300

(22) PCT Filed: May 21, 2021

(86) PCT No.: PCT/JP2021/019323
§ 371 (c)(1),
(2) Date: Nov. 18, 2022

(87) PCT Pub. No.: WO2021/235541
PCT Pub. Date: Nov. 25, 2021

(65) Prior Publication Data
US 2023/0217718 A1  Jul. 6, 2023

(30) Foreign Application Priority Data

May 22, 2020  (JP) ................. 2020-089722

(51) Int. Cl.
| | |
|---|---|
| *H10K 59/122* | (2023.01) |
| *G03F 7/038* | (2006.01) |
| *G03F 7/40* | (2006.01) |
| *H10K 59/12* | (2023.01) |
| *H10K 71/20* | (2023.01) |

(52) U.S. Cl.
CPC ......... *H10K 59/122* (2023.02); *G03F 7/0382* (2013.01); *G03F 7/40* (2013.01); *H10K 59/1201* (2023.02); *H10K 71/233* (2023.02)

(58) Field of Classification Search
CPC ........................... G03F 7/0046; G03F 7/0382
See application file for complete search history.

(56) References Cited

U.S. PATENT DOCUMENTS

| | | | |
|---|---|---|---|
| 2003/0176572 A1 | 9/2003 | Maekawa et al. | |
| 2007/0024168 A1* | 2/2007 | Nishimura | H10K 50/19 313/506 |
| 2009/0017265 A1* | 1/2009 | Eriguchi | G03F 7/325 430/270.1 |
| 2010/0009291 A1 | 1/2010 | Utsumi | |
| 2016/0334707 A1 | 11/2016 | Nagi et al. | |
| 2017/0322488 A1 | 11/2017 | Obi | |
| 2018/0052366 A1* | 2/2018 | Hao | G02F 1/133514 |
| 2020/0295224 A1 | 9/2020 | Yanagawa et al. | |
| 2020/0379299 A1 | 12/2020 | Hibino et al. | |
| 2021/0200099 A1* | 7/2021 | Kaneko | C08F 220/22 |
| 2021/0317245 A1 | 10/2021 | Kaneko et al. | |

FOREIGN PATENT DOCUMENTS

| | | |
|---|---|---|
| CN | 105238197 | 1/2016 |
| EP | 1 873 174 | 1/2008 |
| JP | 2-34617 | 2/1990 |
| JP | 2000-247914 | 9/2000 |
| JP | 2002-40650 | 2/2002 |
| JP | 2003-221406 | 8/2003 |
| JP | 2008-250155 | 10/2008 |
| JP | 2012-108499 | 6/2012 |
| JP | 2015-125197 | 7/2015 |
| JP | 2015-172742 | 10/2015 |
| JP | 2016-142753 | 8/2016 |
| JP | 2018-158966 | 10/2018 |
| KR | 2014-0001915 | 1/2014 |
| TW | 200922949 | 6/2009 |
| TW | 201140237 | 11/2011 |
| TW | 201244222 | 11/2012 |
| TW | 201421155 | 6/2014 |
| TW | 201603347 | 1/2016 |
| TW | 201826025 | 7/2018 |
| TW | 201931589 | 8/2019 |
| WO | 2006/114958 | 11/2006 |
| WO | 2018/043165 | 3/2018 |
| WO | 2019/117018 | 6/2019 |
| WO | 2019/176785 | 9/2019 |
| WO | 2019/225703 | 11/2019 |

* cited by examiner

OTHER PUBLICATIONS

International Search Report issued Jul. 20, 2021 in corresponding International (PCT) Patent Application No. PCT/JP2021/019323.

*Primary Examiner* — Mark S Kaucher
(74) *Attorney, Agent, or Firm* — Wenderoth, Lind & Ponack, L.L.P.

(57) ABSTRACT

Provided is a method of producing a light-emitting element, the method being capable of producing a light-emitting element including a first light emitting layer and banks on the first light emitting layer, without damaging the first light emitting layer. The method of producing a light-emitting element of the present disclosure includes: preparing a base element including a monochromatic first light emitting layer on a substrate; forming a patterned fluororesin film by disposing a photosensitive resin composition at least containing a fluororesin having a crosslinking site and a repeating unit derived from a hydrocarbon containing a fluorine atom, a solvent, and a photopolymerization initiator on the base element such that photosensitive resin composition partitions at least one region of the base element; and baking the patterned fluororesin film at a temperature of 200° C. or lower to cure the patterned fluororesin film.

11 Claims, No Drawings

METHOD FOR PRODUCING LIGHT-EMITTING ELEMENTS

TECHNICAL FIELD

The present disclosure relates to a method of producing a light-emitting element.

BACKGROUND ART

An inkjet method is known as a method of forming organic layers having a light emitting function and the like in the production of display elements such as organic EL displays, micro-LED displays, and quantum dot displays. The inkjet method includes several methods. Specific methods include one in which ink is dropped from a nozzle into recesses of a patterned film having recesses and protrusions formed on a substrate, and the ink is solidified; and one in which a patterned film is formed on a substrate in advance to provide a liquid-affinity portion having wettability with ink and a liquid-repellant portion having repellency to ink, and ink droplets are dropped onto the patterned film, whereby the ink is attached only to the liquid-affinity portion.

Specifically, in the former method in which the ink dropped from a nozzle into recesses of a patterned film is solidified, mainly two methods are applicable to produce such a patterned film having recesses and protrusions. One is photolithography in which a surface of a photosensitive resist film applied to a substrate is exposed to light in a pattern to form exposed portions and non-exposed portions, and either exposed portions or non-exposed portions are dissolved in a developer and removed; and the other is imprinting that uses a printing technique. Generally, after a patterned film having recesses and protrusions is formed, the entire substrate is subjected to UV-ozone treatment or oxygen plasma treatment. With the UV-ozone treatment or oxygen plasma treatment, particularly, residual organic matter in the recesses of the patterned film can be removed, and uneven wetting of the dropped ink is reduced. This can prevent defects in display elements.

The protrusions of the patterned film having recesses and protrusions formed thereon are called banks (partition walls). The banks function as partition walls that prevent ink mixing when ink is dropped into the recesses of the patterned film. To enhance the effect of the partition walls, the substrate surface exposed at the recesses of the patterned film is required to have affinity for ink, and upper surfaces of the banks are required to have ink repellency.

Patent Literature 1 discloses a photosensitive resin composition containing a vinyl polymer including a side chain having an epoxy group.

CITATION LIST

Patent Literature

Patent Literature 1: JP 2016-142753 A

SUMMARY OF INVENTION

Technical Problem

For example, a light-emitting element for quantum dot display is made of a lamination of a first light emitting layer and a second light emitting layer that emits light using light from the first light emitting layer as excitation light.

Production of such a light-emitting element including a first light emitting layer and a second light emitting layer includes forming the first light emitting layer, partitioning a region of the first light emitting layer by banks, and forming the second light emitting layer on the partitioned region.

The photosensitive resin composition of Patent Literature 1 is used to form such banks.

Formation of the banks using the photosensitive resin composition disclosed in Patent Literature 1 involves heating called baking in order to cure the photosensitive resin composition.

The baking is performed after the photosensitive resin composition is disposed on the first light emitting layer, so that the first light emitting layer is also heated by the baking.

In some cases, the heat from the baking damages the first light emitting layer, resulting in insufficient emission.

The present disclosure aims to provide a method of producing a light-emitting element, the method being capable of producing a light-emitting element including a first light emitting layer and banks on the first light emitting layer, without damaging the first light emitting layer.

Solution to Problem

The present inventors conducted extensive studies on the above problems. As a result, they found that the above problems can be solved by baking a photosensitive resin composition at 200° C. or lower, the photosensitive resin composition at least containing a fluororesin having a crosslinking site and a repeating unit derived from a hydrocarbon containing a fluorine atom, a solvent, and a photopolymerization initiator.

The method of producing a light-emitting element of the present disclosure can produce banks without damaging the first light emitting layer because a photosensitive resin composition curable at low temperatures is used.

Thus, a light-emitting element having sufficiently high light-emitting performance can be produced.

Specifically, the present disclosure is as follows.

Invention 1

A method of producing a light-emitting element, including:

preparing a base element including a monochromatic first light emitting layer on a substrate;

forming a patterned fluororesin film by disposing a photosensitive resin composition at least containing a fluororesin having a crosslinking site and a repeating unit derived from a hydrocarbon containing a fluorine atom, a solvent, and a photopolymerization initiator on the base element such that photosensitive resin composition partitions at least one region of the base element; and baking the patterned fluororesin film at a temperature of 200° C. or lower to cure the patterned fluororesin film.

Invention 2

The method of producing a light-emitting element according to Invention 1, further including forming a second light emitting layer that emits light using light from the first light emitting layer as excitation light in the region partitioned by the patterned fluororesin film.

Invention 3

The method of producing a light-emitting element according to Invention 1 or 2, wherein the first light emitting layer is a monochromatic layer.

Invention 4

The method of producing a light-emitting element according to any one of Inventions 1 to 3, wherein the repeating unit derived from a hydrocarbon containing a fluorine atom has a structure represented by the following formula (1):

[Chem. 1]

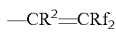

(1)

wherein each Rf independently represents a C1-C6 linear, C3-C6 branched, or C3-C6 cyclic perfluoroalkyl group or a fluorine atom; and $R^2$ represents a hydrogen atom or a C1-C6 linear, C3-C6 branched, or C3-C6 cyclic alkyl group.

Invention 5

The method of producing a light-emitting element according to any one of Inventions 1 to 4, wherein the repeating unit derived from a hydrocarbon containing a fluorine atom has a structure represented by the following formula (2);

[Chem. 2]

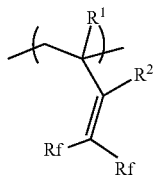

(2)

wherein each Rf independently represents a C1-C6 linear, C3-C6 branched, or C3-C6 cyclic perfluoroalkyl group or a fluorine atom; $R^1$ represents a hydrogen atom, a fluorine atom, or a methyl group; and $R^2$ represents a hydrogen atom or a C1-C6 linear, C3-C6 branched, or C3-C6 cyclic alkyl group.

Invention 6

The method of producing a light-emitting element according to Invention 4 or 5, wherein in the formula (1) or the formula (2), each Rf is a fluorine atom, a trifluoromethyl group, a difluoromethyl group, a pentafluoroethyl group, a 2,2,2-trifluoroethyl group, an n-heptafluoropropyl group, a 2,2,3,3,3-pentafluoropropyl group, a 3,3,3-trifluoropropyl group, a hexafluoroisopropyl group, a heptafluoroisopropyl group, an n-nonafluorobutyl group, an isononafluorobutyl group, or a tert-nonafluorobutyl group.

Invention 7

The method of producing a light-emitting element according to any one of Inventions 1 to 6, wherein the fluororesin has a fluorine content of 20 to 50 mass %.

Invention 8

The method of producing a light-emitting element according to any one of Inventions 1 to 7, wherein the photosensitive resin composition further contains a crosslinking agent.

Invention 9

The method of producing a light-emitting element according to any one of Inventions 1 to 8, wherein the photosensitive resin composition further contains an alkali-soluble resin.

Invention 10

The method of producing a light-emitting element according to any one of Inventions 1 to 9, wherein the photosensitive resin composition further contains a colorant.

Invention 11

The method of producing a light-emitting element according to any one of Inventions 1 to 10, wherein in the baking, the patterned fluororesin film is cured at a temperature of 140° C. or lower.

Invention 12

The method of producing a light-emitting element according to any one of Inventions 1 to 11, further including, after the forming of the patterned fluororesin film, exposing the patterned fluororesin film to high energy rays.

Invention 13

The method of producing a light-emitting element according to Invention 12, wherein the high energy rays are at least one type of rays selected from the group consisting of ultraviolet rays, gamma rays, X-rays, and α-rays.

Invention 14

The method of producing a light-emitting element according to any one of Inventions 1 to 13, wherein the light-emitting element is a light-emitting element for quantum dot display.

Advantageous Effects of Invention

The present disclosure can provide a method of producing a light-emitting element, the method being capable of producing a light-emitting element including a first light emitting layer and banks on the first light emitting layer, without damaging the first light emitting layer.

DESCRIPTION OF EMBODIMENTS

The present disclosure is described in detail below. The following description of structural elements provides exemplary embodiments of the present disclosure. The present disclosure is not limited to these specific embodiments. Various modifications can be made within the scope of the gist.

Herein, "[", "]", "<", and ">" in the DESCRIPTION OF EMBODIMENTS are merely symbols and do not mean anything by themselves.

As used herein, the term "polymer" is a synonym to the term "resin", and these terms refer to a high molecular weight compound unless otherwise specified.

Herein, the term "bank" or "banks" is a synonym to the term "partition wall" or "partition walls", and these terms refer to protrusion(s) of a patterned film having recesses and protrusions formed by the inkjet method, unless otherwise specified.

Herein, the expression "upper surfaces of the banks" refers to the upper surfaces (surfaces away from the substrate surface in the vertical direction) of protrusions of a patterned film having recesses and protrusions formed by the inkjet method. The expression does not encompass the wall surfaces of the protrusions.

Herein, the expression "resistance to UV-ozone treatment or oxygen plasma treatment" means that the film loss is small, i.e., the film thickness change is small, before and after UV-ozone treatment or oxygen plasma treatment.

The method of producing a light-emitting element of the present disclosure includes: preparing a base element including a monochromatic first light emitting layer on a substrate; forming a patterned fluororesin film by disposing a photosensitive resin composition at least containing a fluororesin having a crosslinking site and a repeating unit derived from a hydrocarbon containing a fluorine atom, a solvent, and a photopolymerization initiator on the base element such that photosensitive resin composition partitions at least one region of the base element; and baking the patterned fluororesin film at a temperature of 200° C. or lower to cure the patterned fluororesin film.

The method of producing a light-emitting element of the present disclosure can form banks without significant heat damage to the first light emitting layer because a photosensitive resin composition curable at low temperatures is used.

Thus, a light-emitting element having sufficiently high light-emitting performance can be produced.

Hereinafter, the steps of the method of producing a light-emitting element of the present disclosure are described.

<Preparing Base Element>

In the method of producing a light-emitting element of the present disclosure, first, a base element including a first light emitting layer is prepared on a substrate.

The substrate is not limited and may be a silicon wafer, a metal, a glass, an ITO substrate, a substrate containing a metal oxide, a synthetic resin (polyimide, polycarbonate, or polyester), or the like.

The first light emitting layer is not limited but is preferably made of an organic EL light emitting material, a LED material such as mini-LED, µ-LED, or nano-LED, or a quantum dot light emitting material.

The first light emitting layer may be a monochromatic layer or a multichromatic layer, but a monochromatic layer is preferred. Preferably, the first light emitting layer is a light emitting layer that emits monochromatic blue light.

An organic or inorganic film may be disposed between the substrate and the first light emitting layer. For example, an underlayer such as an anti-reflective film or a multilayer resist may be present.

A drive circuit and a flattening layer may be formed between the substrate and the first light emitting layer.

Examples of the flattening layer include a TFT flattening layer.

When the first light emitting layer is made of a LED light emitting material, an electrode may be formed between the substrate and the first light emitting layer.

The substrate may be pre-washed when the first light emitting layer is disposed on the substrate. For example, the substrate may be washed with ultrapure water, acetone, an alcohol (methanol, ethanol, or isopropyl alcohol), or the like.

<Forming a Patterned Fluororesin Film>

Next, a photosensitive resin composition at least containing a fluororesin having a crosslinking site and a repeating unit derived from a hydrocarbon containing a fluorine atom, a solvent, and a photopolymerization initiator is prepared.

Then, a patterned fluororesin film is formed by disposing the photosensitive resin composition on the base element such that the photosensitive resin composition partitions at least one region of the base element.

The forming of the patterned fluororesin film may include (a) forming a film, (b) exposing, and (c) developing.

(a) Forming a Film

First, the photosensitive resin composition is applied to the first light emitting layer of the base element.

Any known method such as spin coating can be used to apply the photosensitive resin composition to the first light emitting layer.

Next, the photosensitive resin composition is heated into a fluororesin film.

Heating conditions are not limited, but heating at 80° C. to 100° C. for 60 to 200 seconds is preferred.

This can remove solvents and the like contained in the photosensitive resin composition.

A barrier layer made of an organic material or inorganic material may be formed between the base element and the photosensitive resin composition.

Examples of the organic material include an epoxy resin and a vinyl resin. Examples of the inorganic material include SiN, SiON, and $SiO_2$.

When the first light emitting layer is made of a LED light emitting material, an electrode may be formed between the first light emitting layer and the photosensitive resin composition.

(b) Exposing

Next, a desired photo mask is set in an exposure device, and the fluororesin film is exposed to high energy rays through the photo mask.

The high energy rays are preferably at least one type of rays selected from the group consisting of ultraviolet rays, gamma rays, X-rays, and α-rays.

The amount of exposure of high energy rays is preferably 1 $mJ/cm^2$ or more and 200 $mJ/cm^2$ or less, more preferably 10 $mJ/cm^2$ or more and 100 $mJ/cm^2$ or less.

(c) Developing

Next, the fluororesin film after the exposing is developed with an alkaline aqueous solution to obtain a patterned fluororesin film.

Specifically, either the exposed or non-exposed portions of the fluororesin film are dissolved in an alkaline aqueous solution to obtain a patterned fluororesin film.

The alkaline aqueous solution may be, for example, a tetramethylammonium hydroxide (TMAH) aqueous solution, a tetrabutylammonium hydroxide (TEAR) aqueous solution, sodium hydroxide, potassium hydroxide, or the like.

When the alkaline aqueous solution is a tetramethylammonium hydroxide (TMAH) aqueous solution, the concentration thereof is preferably 0.1 mass % or more and 5 mass % or less, more preferably 2 mass % or more and 3 mass % or less.

Any known development method, such as dipping, paddling, or spraying, can be used.

The development time (contact time of the developer with the fluororesin film) is preferably 10 seconds or more and 3 minutes or less, more preferably 30 seconds or more and 2 minutes or less.

After development, the patterned fluororesin film may be washed with deionized water or the like, if necessary. Regarding the washing method and washing time, washing for 10 seconds or more and 3 minutes or less is preferred, and washing for 30 seconds or more and 2 minutes or less is more preferred.

Next, the components in the photosensitive resin composition are described below.

(Fluororesin)

Preferably, the repeating unit derived from a hydrocarbon containing a fluorine atom in the fluororesin has a structure represented by the following formula (1), and more preferably, the repeating unit derived has a structure represented by the following formula (2):

[Chem. 3]

$-CR^2=CRf_2$ (1)

wherein each Rf independently represents a C1-C6 linear, C3-C6 branched, or C3-C6 cyclic perfluoroalkyl group or a fluorine atom; and $R^2$ represents a hydrogen atom or a C1-C6 linear, C3-C6 branched, or C3-C6 cyclic alkyl group;

[Chem. 4]

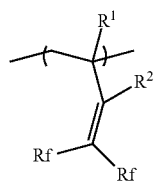

(2)

wherein each Rf independently represents a C1-C6 linear, C3-C6 branched, or C3-C6 cyclic perfluoroalkyl group or a fluorine atom; $R^1$ represents a hydrogen atom, a fluorine atom, or a methyl group; and $R^2$ represents a hydrogen atom or a C1-C6 linear, C3-C6 branched, or C3-C6 cyclic alkyl group.

In the formula (2), $R^1$ is preferably a hydrogen atom or a methyl group. Examples of $R^2$ include a hydrogen atom, a methyl group, an ethyl group, an n-propyl group, an isopropyl group, an n-butyl group, a 1-methylpropyl group, a 2-methylpropyl group, a tert-butyl group, an n-pentyl group, an isopentyl group, a 1,1-dimethylpropyl group, a 1-methylbutyl group, a 1,1-dimethylbutyl group, an n-hexyl group, a cyclopentyl group, and a cyclohexyl group. A hydrogen atom, a methyl group, an ethyl group, an n-propyl group, and an isopropyl group are preferred. A hydrogen atom and a methyl group are more preferred.

In the formula (1) or formula (2), each Rf is preferably a fluorine atom, a trifluoromethyl group, a difluoromethyl group, a pentafluoroethyl group, a 2,2,2-trifluoroethyl group, an n-heptafluoropropyl group, a 2,2,3,3,3-pentafluoropropyl group, a 3,3,3-trifluoropropyl group, a hexafluoroisopropyl group, a heptafluoroisopropyl group, an n-nonafluorobutyl group, an isononafluorobutyl group, or a tert-nonafluorobutyl group; more preferably a fluorine atom, a trifluoromethyl group, a difluoromethyl group, a pentafluoroethyl group, a 2,2,2-trifluoroethyl group, an n-heptafluoropropyl group, a 2,2,3,3,3-pentafluoropropyl group, a 3,3,3-trifluoropropyl group, or a hexafluoroisopropyl group; particularly preferably a fluorine atom, a difluoromethyl group, or a trifluoromethyl group.

The following are examples of preferred structures of the repeating unit derived from a hydrocarbon containing a fluorine atom in the fluororesin.

[Chem. 5]

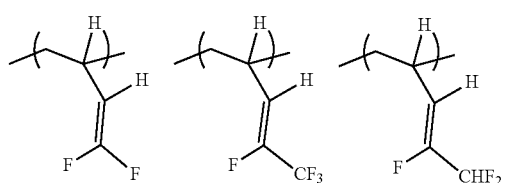
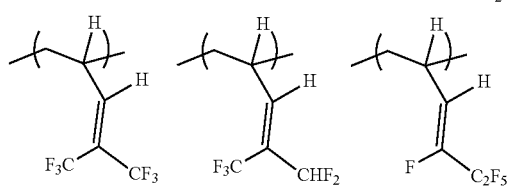
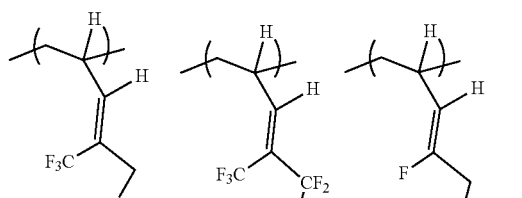
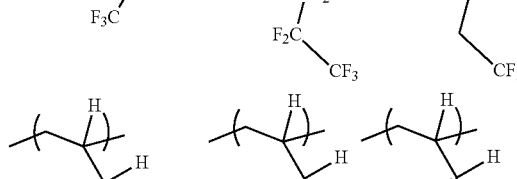
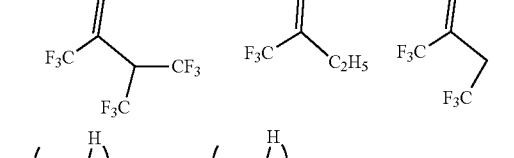
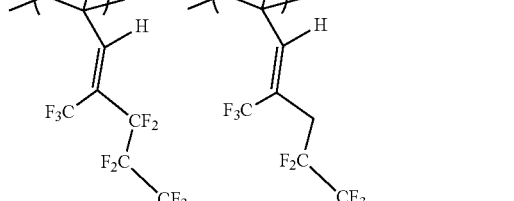
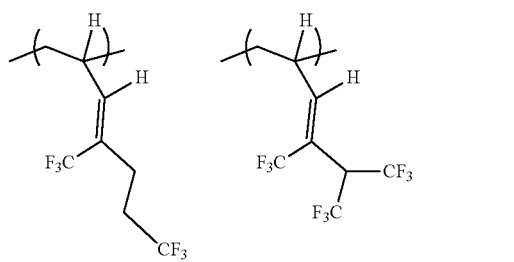

-continued

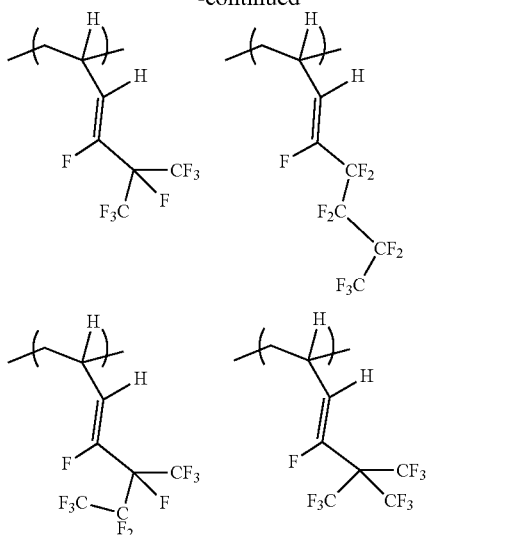

[Chem. 6]

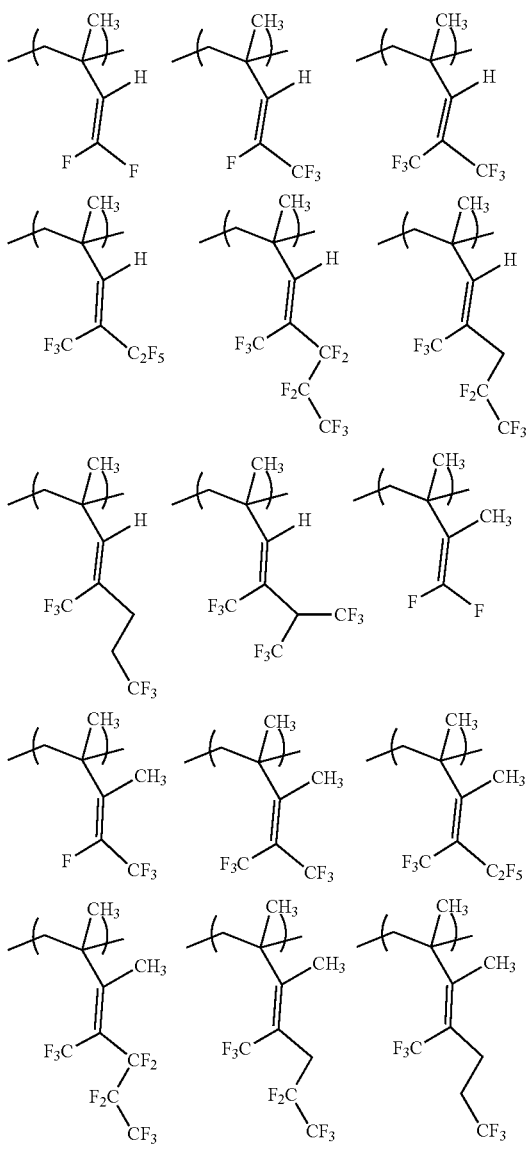

-continued

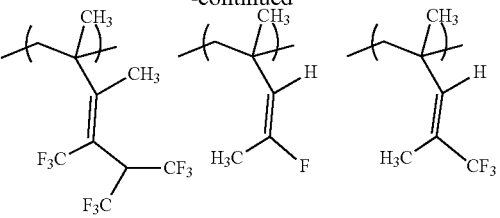

The amount of the repeating unit represented by the formula (2) in the fluororesin is preferably 5 mass % or more and 70 mass % or less, more preferably 10 mass % or more and 50 mass % or less, particularly preferably 10 mass % or more and 30 mass % or less, relative to 100 mass % of the fluororesin.

When the amount of the repeating unit represented by the formula (2) is more than 70 mass %, the fluororesin tends to be poorly soluble in solvents. When the amount of the repeating unit represented by the formula (2) is less than 5 mass %, the resistance against UV-ozone treatment or oxygen plasma treatment tends to decrease.

Depending on use, for example, a method in which the fluororesin is directly pressed under heat without being dissolved in solvents (i.e., a hot-press method) can be used to form a fluororesin film. In this case, use of the repeating unit represented by the formula (2) in an amount of more than 70 mass % does not result in either poor resistance of the whole fluororesin to UV-ozone treatment or oxygen plasma treatment or poor ink repellency after UV-ozone treatment or oxygen plasma treatment, and such use is thus not restricted in the present disclosure.

The fluororesin may have a structure represented by the following formula (3).

[Chem. 7]

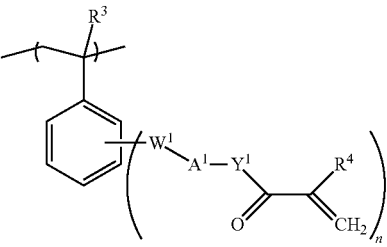

(3)

In the formula (3), $R^3$ and $R^4$ each independently represent a hydrogen atom or a methyl group.

In the formula (3), $W^1$ is a divalent linking group and represents —O—, —O—C(=O)—, —C(=O)—O—, —O—C(=O)—NH—, —C(=O)—O—C(=O)—NH—, or —C(=O)—NH—. Preferred of these are —O—C(=O)—NH—, —C(=O)—O—C(=O)—NH—, and —C(=O)—NH—.

The fluororesin in which $W^1$ is —O—C(=O)—NH— has higher ink repellency after UV-ozone treatment or oxygen plasma treatment and is thus one particularly preferred embodiment.

In the formula (3), $A^1$ is a divalent linking group and represents a C1-C10 linear, C3-C10 branched, or C3-C10 cyclic alkylene group in which one or more hydrogen atoms in the alkylene group may be substituted by hydroxy groups or —O—C(=O)—CH$_3$.

When the divalent linking group $A^1$ is a C1-C10 linear alkylene group, examples thereof include a methylene group, an ethylene group, a propylene group, an n-butylene group, an n-pentylene group, an n-hexalene group, an n-heptalene group, an n-octalene group, an n-nonalene group, and an n-decalene group.

When the divalent linking group $A^1$ is a C3-O10 branched alkylene group, examples thereof include an isopropylene group, an isobutylene group, a sec-butylene group, a tert-butylene group, an isopentalene group, and an isohexalene group.

When the divalent linking group $A^1$ is a C3-C10 cyclic alkylene group, examples thereof include disubstituted cyclopropane, disubstituted cyclobutane, disubstituted cyclopentane, disubstituted cyclohexane, disubstituted cycloheptane, disubstituted cyclooctane, disubstituted cyclodecane, and disubstituted 4-tert-butylcyclohexane.

When one or more hydrogen atoms in these alkylene groups are substituted by hydroxy groups, examples of these hydroxy group-substituted alkylene groups include a hydroxyethylene group, a 1-hydroxy-n-propylene group, a 2-hydroxy-n-propylene group, a hydroxy-isopropylene group (—CH(CH$_2$OH)CH$_2$—), a 1-hydroxy-n-butylene group, a 2-hydroxy-n-butylene group, a hydroxy-sec-butylene group (—CH(CH$_2$OH)CH$_2$CH—), a hydroxy-isobutylene group (—CH$_2$CH(CH$_2$OH)CH$_2$—), and a hydroxy-tert-butylene group (—C(CH$_2$OH)(CH$_3$)CH$_2$—).

When one or more hydrogen atoms in these alkylene groups are substituted by —O—C(=O)—CH$_3$, examples of these substituted alkylene groups include those in which hydroxy groups of the hydroxy group-substituted alkylene groups exemplified above are substituted by —O—C(=O)—CH$_3$.

The divalent linking group $A^1$ is preferably a methylene group, an ethylene group, a propylene group, an n-butylene group, an isobutylene group, a sec-butylene group, a cyclohexyl group, a 2-hydroxy-n-propylene group, a hydroxy-isopropylene group (—CH(CH$_2$OH)CH$_2$—), a 2-hydroxy-n-butylene group, or a hydroxy-sec-butylene group (—CH(CH$_2$OH)CH$_2$CH$_2$—), more preferably an ethylene group, a propylene group, a 2-hydroxy-n-propylene group, or a hydroxy-isopropylene group (—CH(CH$_2$OH)CH$_2$—), particularly preferably an ethylene group or a 2-hydroxy-n-propylene group.

In the formula (3), $Y^1$ is a divalent linking group and represents —O— or —NH—, with —O— being more preferred.

In the formula (3), n represents an integer of 1 to 3, with n of 1 being particularly preferred.

The substituents are each independently in the ortho, meta, or para position of the aromatic ring, with the para position being preferred.

The following are examples of preferred structures of the repeating unit represented by the formula (3). In the examples, the substituent position in the aromatic ring is the para position. Yet, the substituents may be each independently in the ortho or meta position.

The following are examples of preferred structures of the repeating unit represented by the formula (3). In the examples, the substituent position in the aromatic ring is the para position. Yet, the substituents may be each independently in the ortho or meta position.

[Chem. 8]

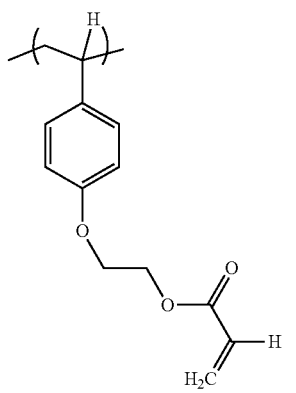

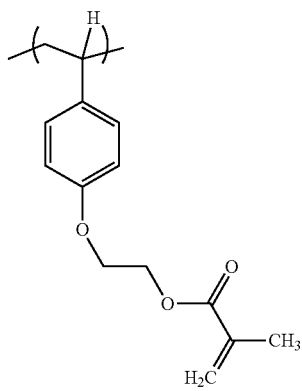

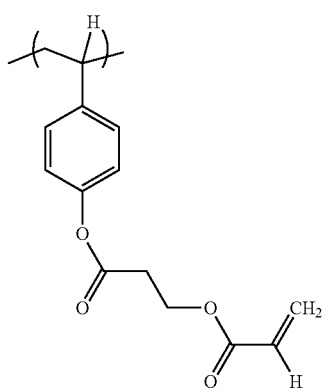

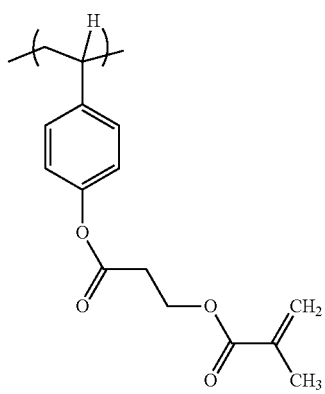

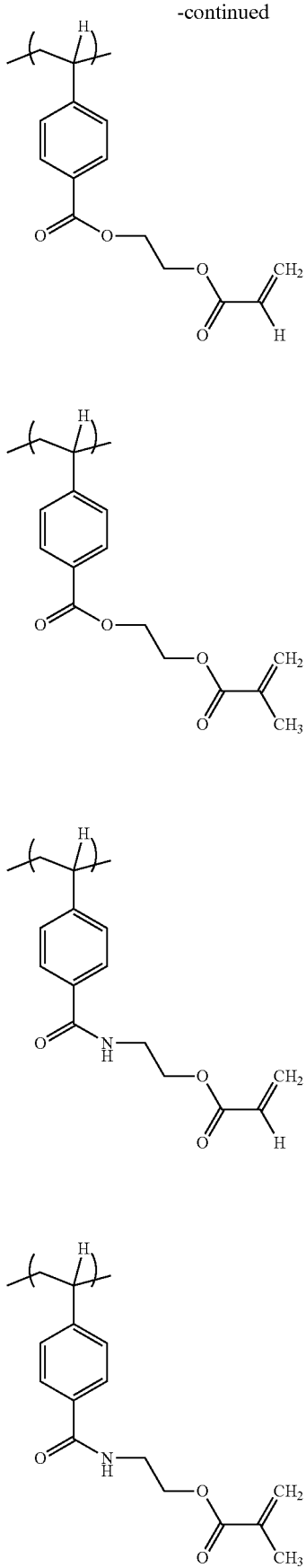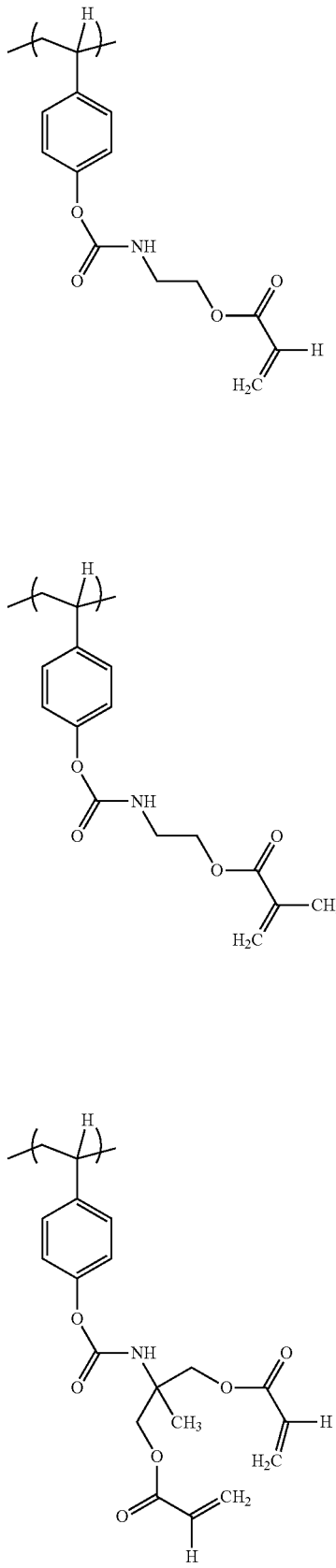
[Chem. 9]

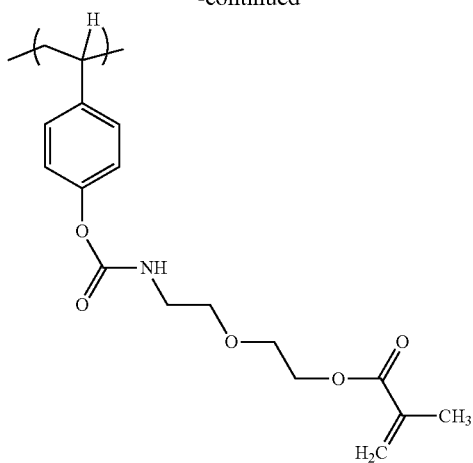
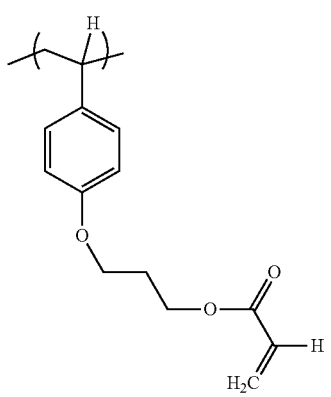
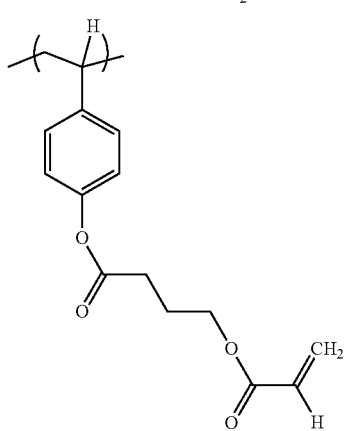
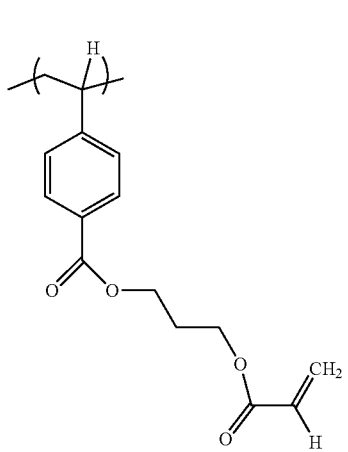
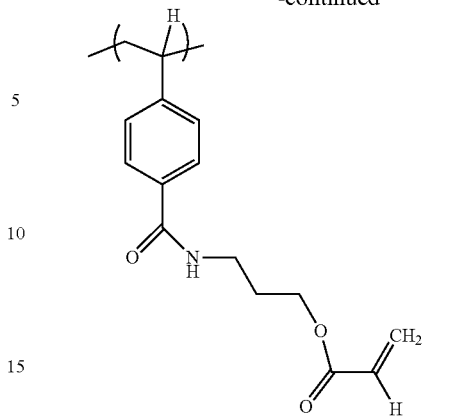
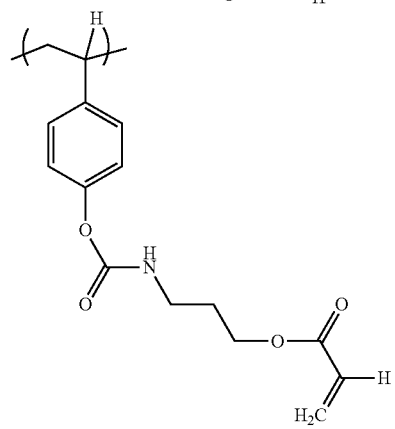
[Chem. 10]
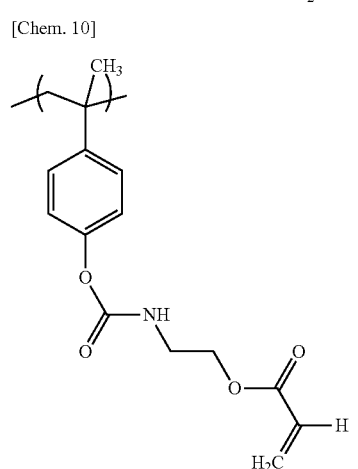
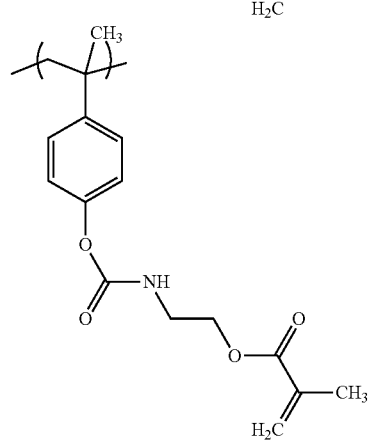

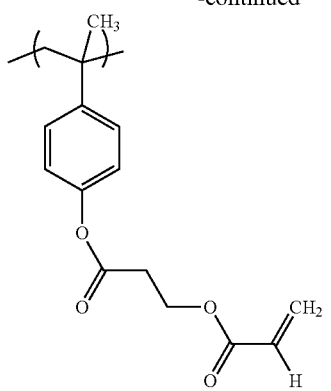
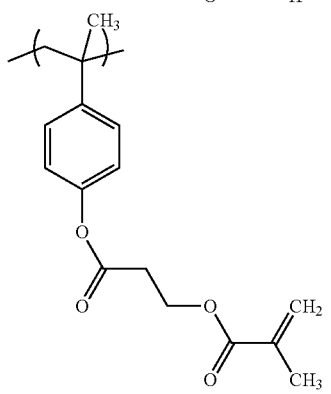
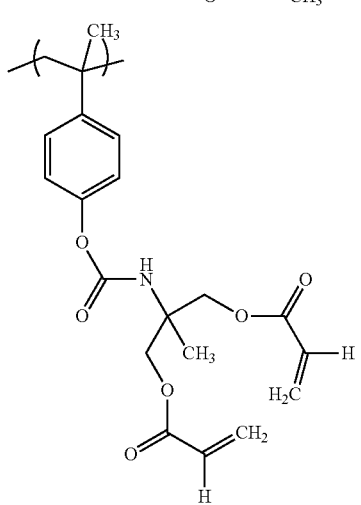
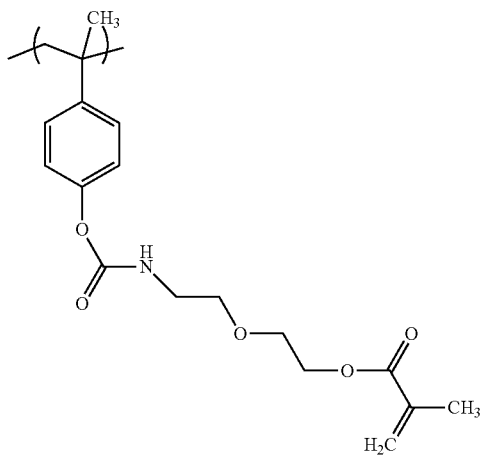
[Chem. 11]
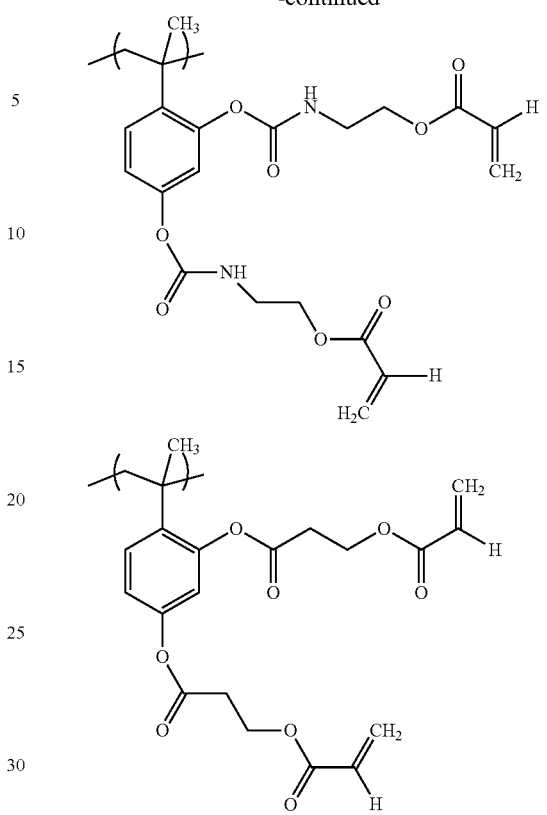
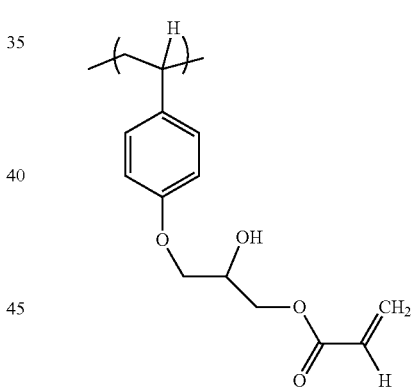
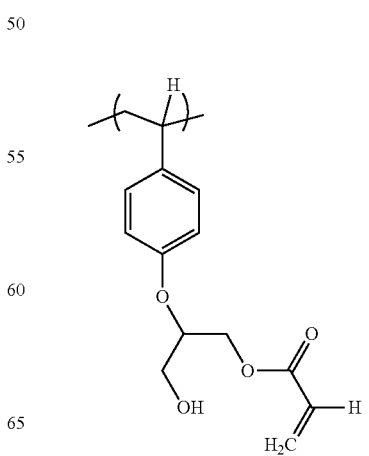

-continued

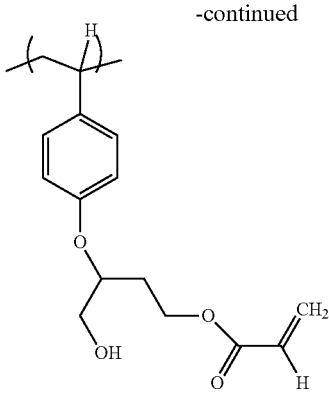

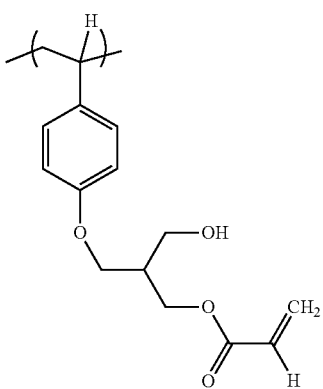

The amount of the repeating unit represented by the formula (3) in the fluororesin is preferably 5 mass % or more and 70 mass % or less, more preferably 10 mass % or more and 50 mass % or less, particularly preferably 10 mass % or more and 30 mass % or less, relative to 100 mass % of the fluororesin.

When the amount of the repeating unit represented by the formula (3) is more than 70 mass %, the fluororesin tends to be hardly soluble in solvents. When the amount of the repeating unit represented by the formula (3) is less than 5 mass %, the resistance against UV-ozone treatment or oxygen plasma treatment tends to decrease.

It is assumed (although not confirmed) that the effect of the repeating unit represented by the formula (3) is resistance to UV-ozone treatment oxygen plasma. The effects of the present disclosure are not limited to those described herein.

As described above, the fluororesin may be a mixture (blend) of a copolymer containing a repeating unit represented by the formula (2) and a repeating unit represented by the formula (3) and another type of copolymer containing a repeating unit represented by the formula (2) and a repeating unit represented by the formula (3). In particular, the fluororesin is preferably a mixture of a fluororesin containing a repeating unit represented by the formula (3) in which $W^1$ is —O—C(=O)—NH— and a fluororesin containing a repeating unit represented by the formula (3) in which $W^1$ is —C(=O)—NH—.

The fluororesin may have a structure represented by the following formula (4).

[Chem. 12]

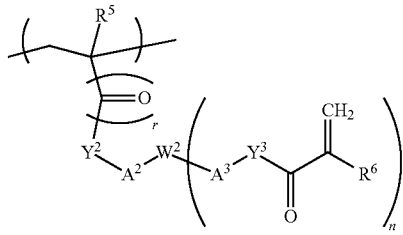

(4)

In the formula (4), $R^5$ and $R^6$ each independently represent a hydrogen atom or a methyl group.

In the formula (4), $W^2$ is a divalent linking group and represents —O—, —O—C(=O)—, —C(=O)—O—, —O—C(=O)—NH—, —C(=O)—O—C(=O)—NH—, or —C(=O)—NH—. Preferred of these are —O—C(=O)—NH—, —C(=O)—O—C(=O)—NH—, and —C(=O)—NH—.

The fluororesin in which $W^2$ is —O—C(=O)—NH— has higher ink repellency after UV-ozone treatment or oxygen plasma treatment of the fluororesin and is thus one of particularly preferred embodiments.

In the formula (4), $A^2$ and $A^3$ are divalent linking groups and each independently represent a C1-C10 linear, C3-C10 branched, or C3-C10 cyclic alkylene group in which one or more hydrogen atoms in the alkylene group may be substituted by hydroxy groups or —O—C(=O)—CH$_3$.

When the divalent linking groups $A^2$ and $A^3$ are each independently a C1-C10 linear alkylene group, examples thereof include a methylene group, an ethylene group, a propylene group, an n-butylene group, an n-pentylene group, an n-hexalene group, an n-heptalene group, an n-octalene group, an n-nonalene group, and an n-decalene group.

When the divalent linking groups $A^2$ and $A^3$ are each independently a C3-C10 branched alkylene group, examples thereof include an isopropylene group, an isobutylene group, a sec-butylene group, a tert-butylene group, an isopentalene group, and an isohexalene group.

When the divalent linking groups $A^2$ and $A^3$ are each independently a C3-C10 cyclic alkylene group, examples thereof include disubstituted cyclopropane, disubstituted cyclobutane, disubstituted cyclopentane, disubstituted cyclohexane, disubstituted cycloheptane, disubstituted cyclooctane, disubstituted cyclodecane, and disubstituted 4-tert-butylcyclohexane.

When one or more hydrogen atoms in these alkylene groups are substituted by hydroxy groups, examples of these hydroxy group-substituted alkylene groups include a 1-hydroxyethylene group (—CH(OH)CH$_2$—), a 2-hydroxyethylene group (—CH$_2$CH(OH)—), a 1-hydroxy-n-propylene group, a 2-hydroxy-n-propylene group, a hydroxy-isopropylene group (—CH(CH$_2$OH)CH$_2$—), a 1-hydroxy-n-butylene group, a 2-hydroxy-n-butylene group, a hydroxy-sec-butylene group (—CH(CH$_2$OH)CH$_2$CH$_2$—), a hydroxy-isobutylene group (—CH$_2$CH(CH$_2$OH)CH$_2$—), and a hydroxy-tert-butylene group (—C(CH$_2$OH)(CH$_3$)CH$_2$—).

When one or more hydrogen atoms in these alkylene groups are substituted by —O—C(=O)—CH$_3$, examples of these substituted alkylene groups include those in which hydroxy groups of the hydroxy group-substituted alkylene groups exemplified above are substitute bed by —O—C(=O)—CH$_3$.

Preferably, the divalent linking groups A$^2$ and A$^3$ are each independently a methylene group, an ethylene group, a propylene group, an n-butylene group, an isobutylene group, a sec-butylene group, a cyclohexyl group, a 1-hydroxyethylene group (—CH(OH)CH$_2$—), a 2-hydroxyethylene group (—CH$_2$CH(OH)—), a 2-hydroxy-n-propylene group, a hydroxy-isopropylene group (—CH(CH$_2$OH)CH$_2$—), a 2-hydroxy-n-butylene group, or a hydroxy-sec-butylene group (—CH(CH$_2$OH)CH$_2$CH$_2$—), more preferably an ethylene group, a propylene group, a 1-hydroxyethylene group (—CH(OH)CH$_3$—), a 2-hydroxyethylene group (—CH$_2$CH(OH)—), a 2-hydroxy-n-propylene group, or a hydroxy-isopropylene group (—CH(CH$_2$OH)CH$_2$—), particularly preferably an ethylene group, a 1-hydroxyethylene group (—CH(OH)CH$_2$—), or a 2-hydroxyethylene group (—CH$_2$CH(OH)—).

In the formula (4), Y$^2$ and Y$^3$ are divalent linking groups and each independently represent —O— or —NH—, with —O— being more preferred.

In the formula (4), n represents an integer of 1 to 3, with n of 1 being particularly preferred.

In the formula (4), r represents 0 or 1. When r is 0, (—C(=O)—) represents a single bond.

The following are examples of preferred structures of the repeating unit represented by the formula (4).

[Chem. 13]

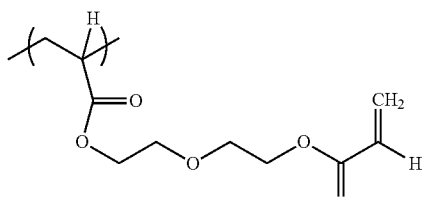

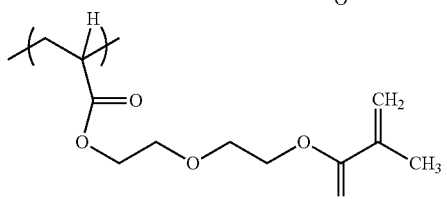

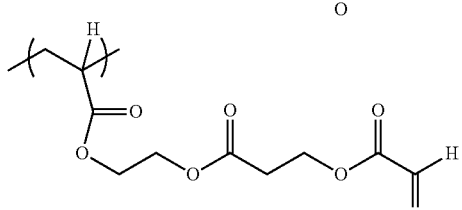

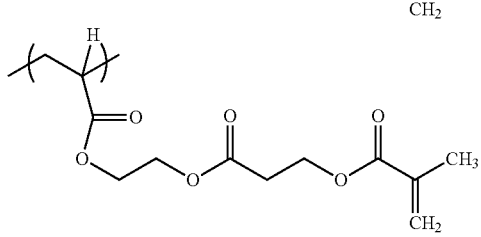

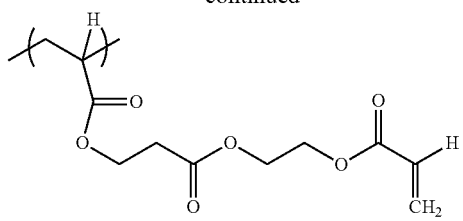

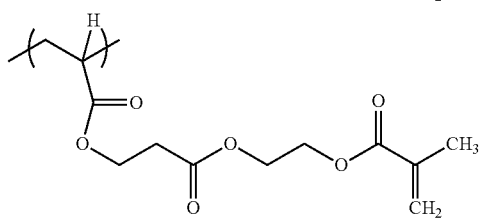

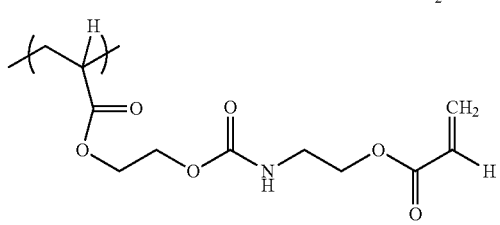

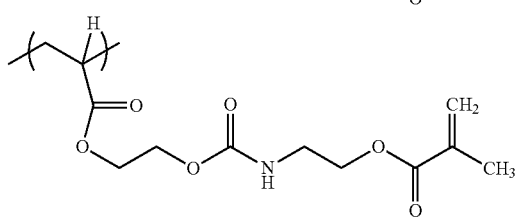

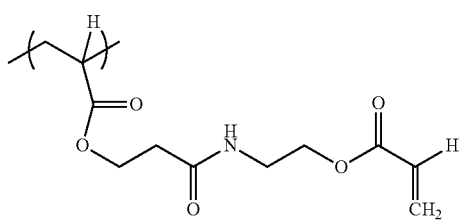

[Chem. 14]

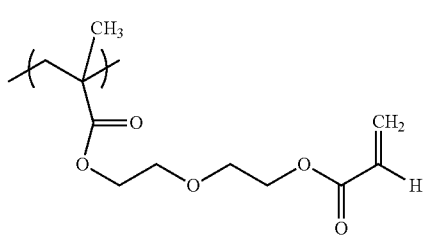

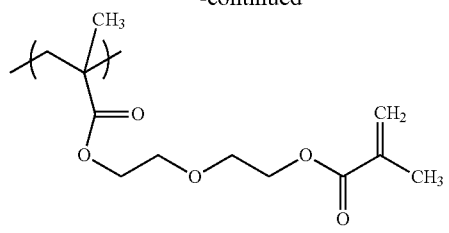
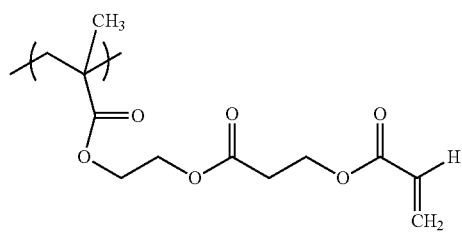
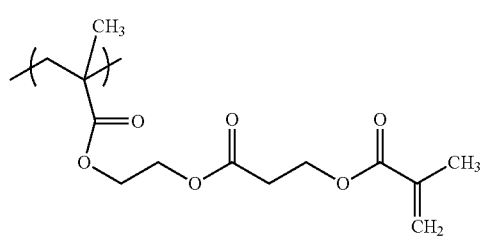
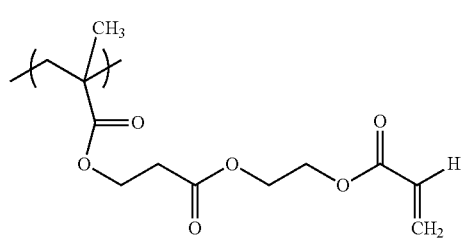
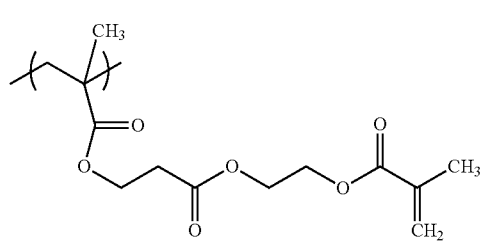
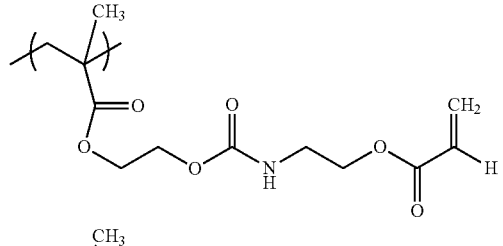
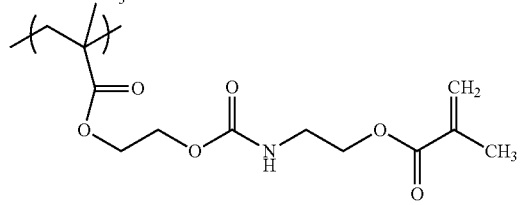
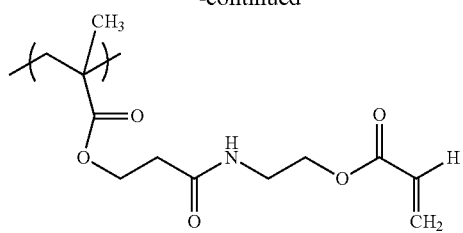
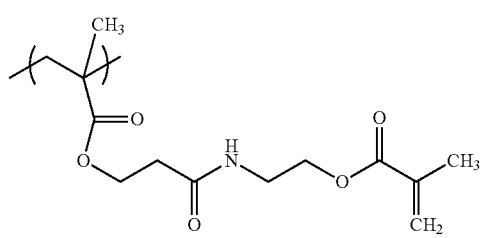
[Chem. 15]
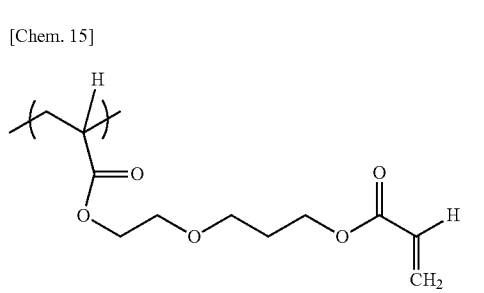
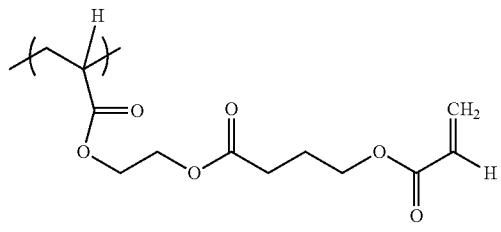
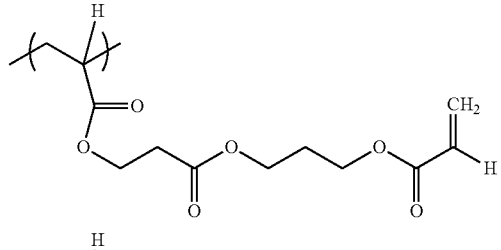
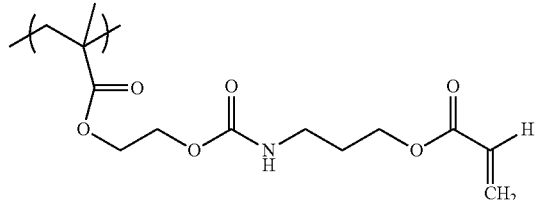
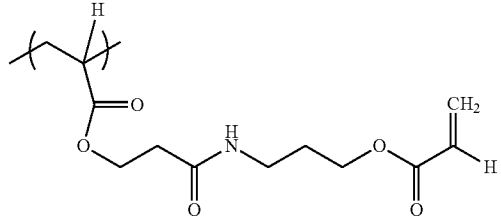

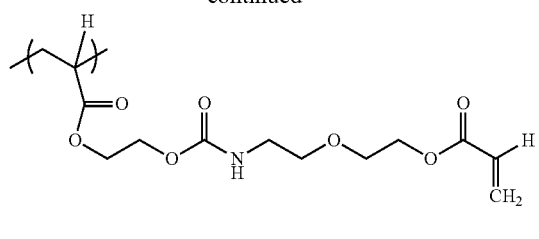
[Chem. 16]
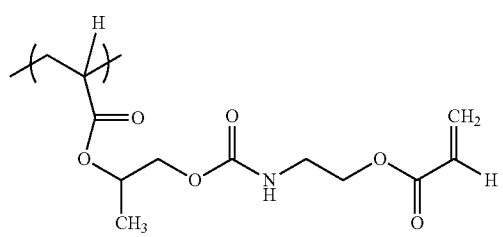
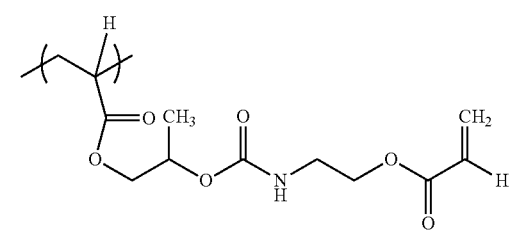
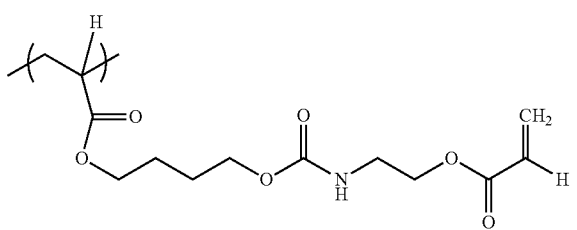
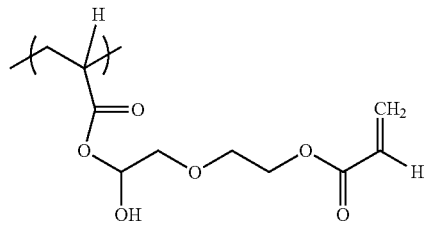
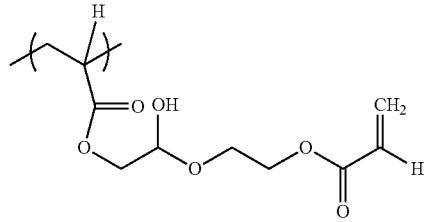
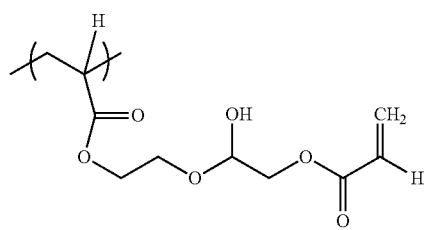
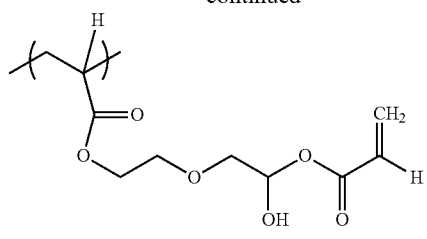
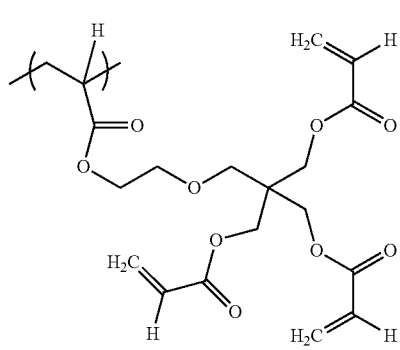
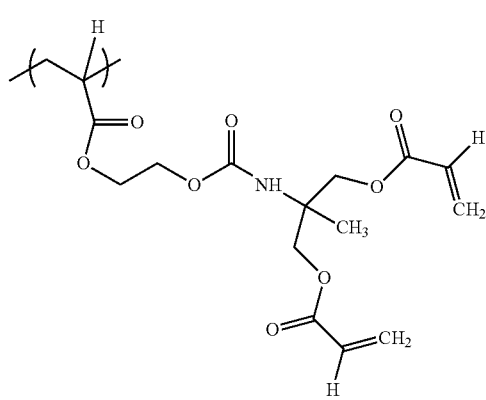
[Chem. 17]
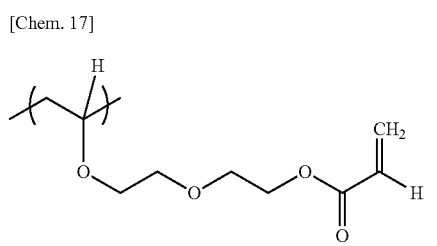
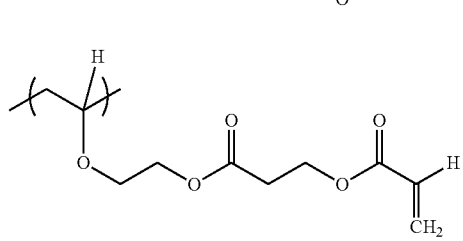
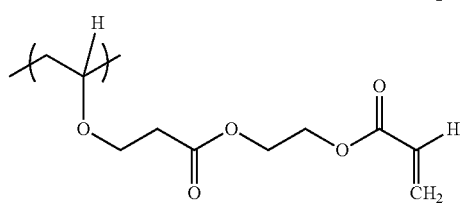

-continued

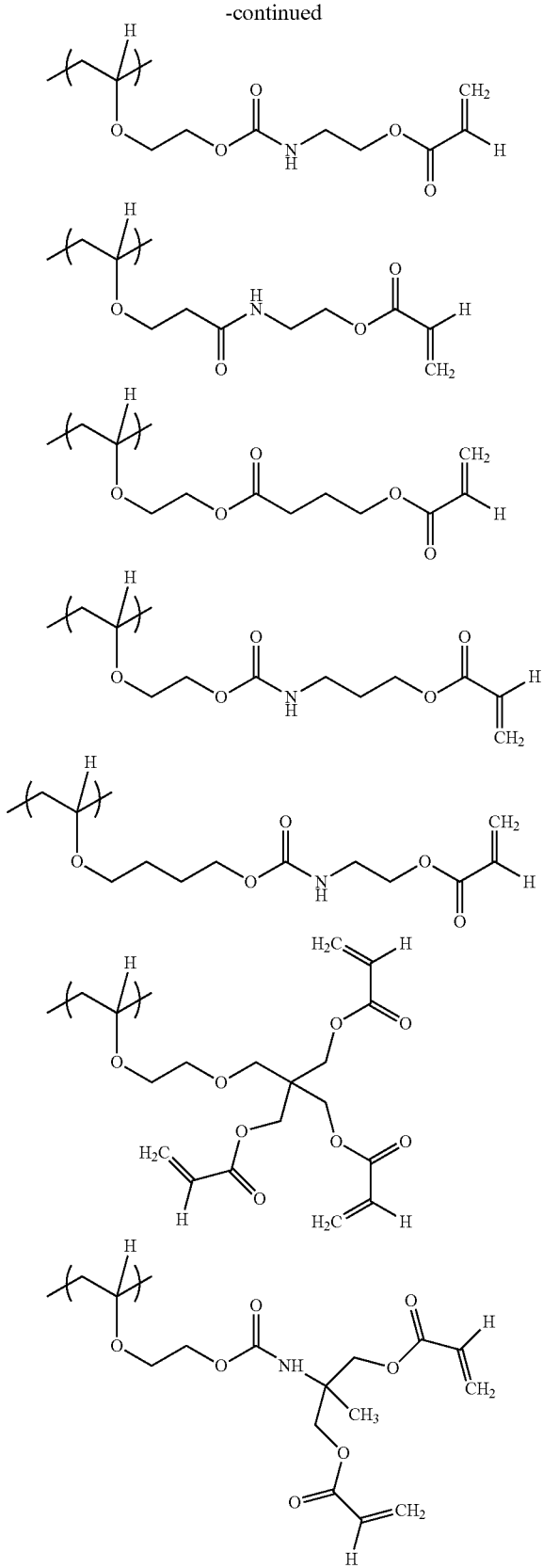

The amount of the repeating unit represented by the formula (4) in the fluororesin is preferably 5 mass % or more and 70 mass % or less, more preferably 10 mass % or more and 50 mass % or less, particularly preferably 10 mass % or more and 30 mass % or less, relative to 100 mass % of the fluororesin.

When the amount of the repeating unit represented by the formula (4) is more than 70 mass %, the fluororesin tends to be poorly soluble in solvents. When the amount of the repeating unit represented by the formula (4) is less than 5 mass %, a fluororesin film or banks obtainable from the fluororesin tend to have lower adhesion to the substrate.

It is assumed (although not confirmed) that the repeating unit represented by the formula (4) in the fluororesin has an effect of improving the adhesion of the resulting fluororesin film or banks to the substrate. The effects of the present disclosure are not limited to those described herein.

The fluororesin may be a mixture (blend) of a copolymer containing a repeating unit represented by the formula (2) and a repeating unit represented by the formula (4) and another type of copolymer containing a repeating unit represented by the formula (2) and a repeating unit represented by the formula (4). In particular, the fluororesin is preferably a mixture of a fluororesin containing a repeating unit represented by the formula (4) in which $W^2$ is —O—C(=O)—NH— and a fluororesin containing a repeating unit represented by the formula (4) in which $W^2$ is —C(=O)—NH—.

The fluororesin may have a structure represented by the following formula (5).

[Chem. 18]

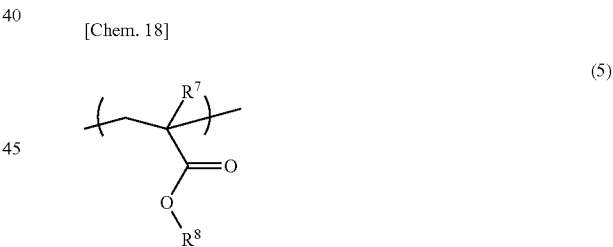

(5)

In the formula (5), represents a hydrogen atom or a methyl group.

In the formula (5), $R^8$ represents a hydrogen atom, a C1-C15 linear, C3-C15 branched, or C3-C15 cyclic alkyl group in which one or more hydrogen atoms in the alkyl group are substituted by fluorine atoms, and the repeating unit has a fluorine content of 30 mass % or more.

When $R^8$ is a linear hydrocarbon group, specific examples thereof include a methyl group, an ethyl group, a propyl group, a butyl group, a pentyl group, a hexyl group, a heptyl group, an octyl group, a nonyl group, and C10-C14 linear alkyl groups in which one or more hydrogen atoms are substituted by fluorine atoms.

When $R^8$ is a linear hydrocarbon group, the repeating unit represented by the formula (5) is preferably a repeating unit represented by the following formula (5-1).

[Chem. 19]

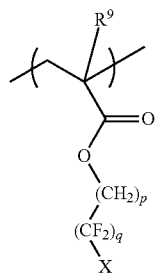

(5-1)

In the formula (5-1), $R^9$ is the same as $R^7$ in the formula (5).

In the formula (5-1), X is a hydrogen atom or a fluorine atom.

In the formula (5-1), p is an integer of 1 to 4. q is an integer of 1 to 14. Particularly preferably, p is an integer of 1 or 2, q is an integer of 2 to 8, and X is a fluorine atom.

The following are examples of preferred structures of the repeating unit represented by the formula (5).

[Chem. 20]

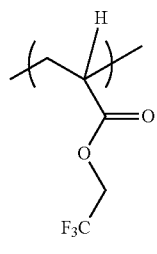

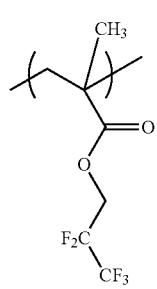

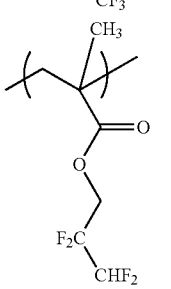

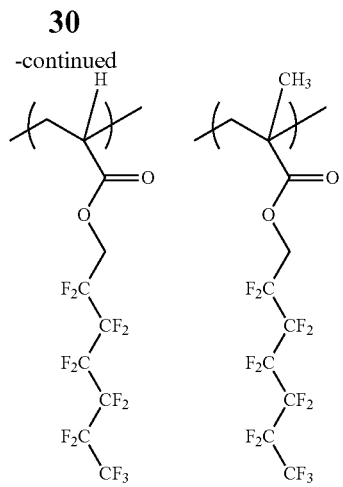

-continued

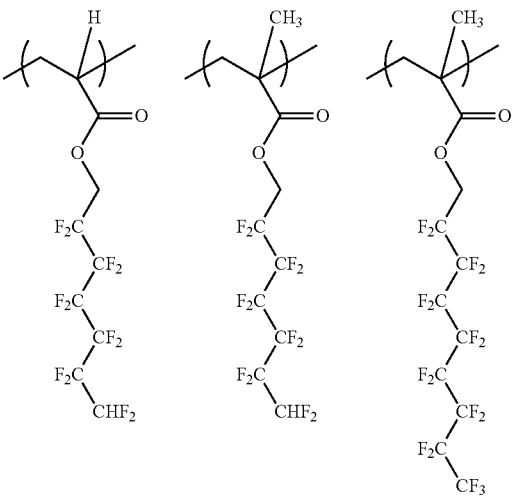

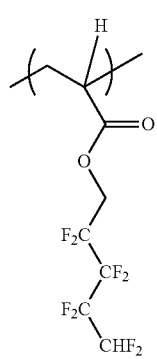

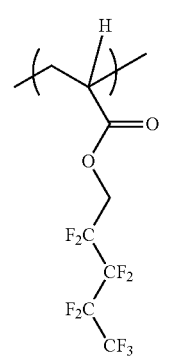

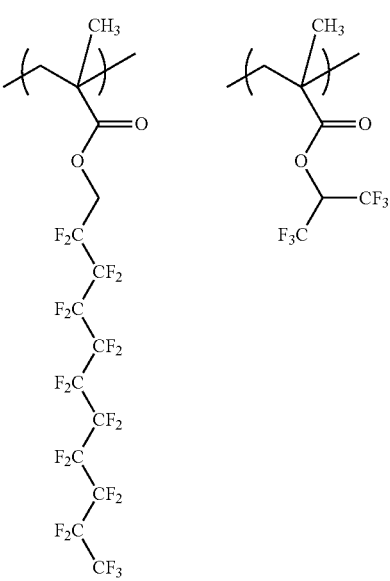

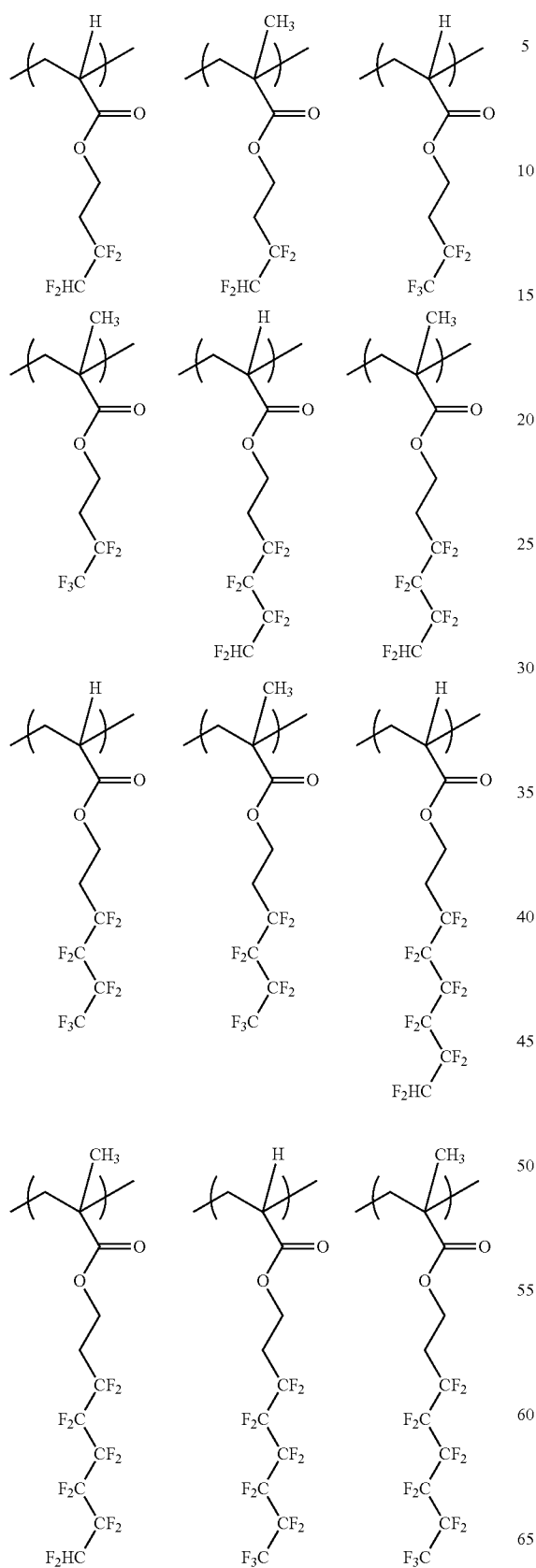
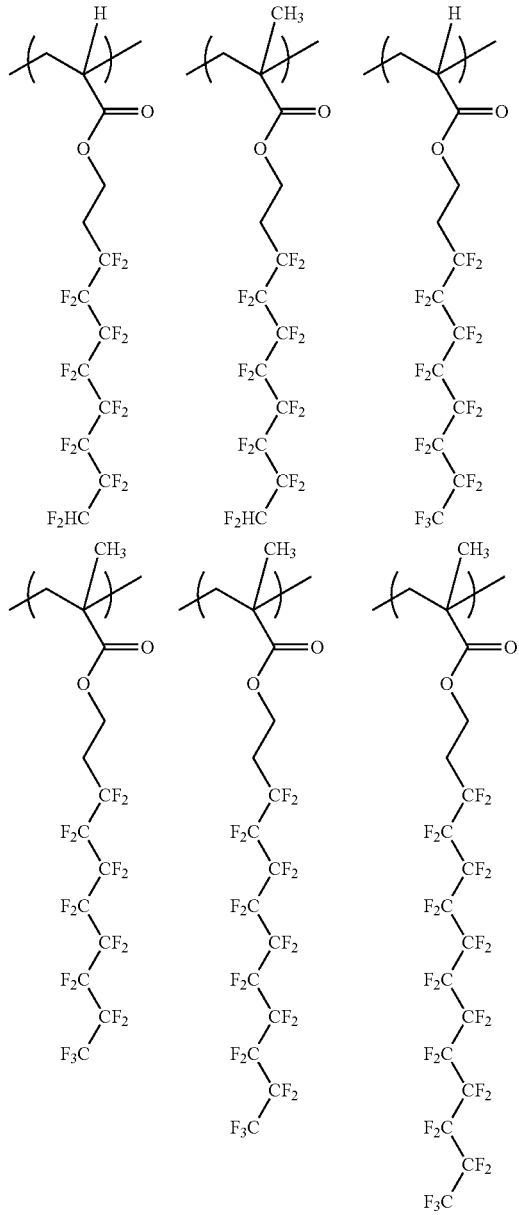
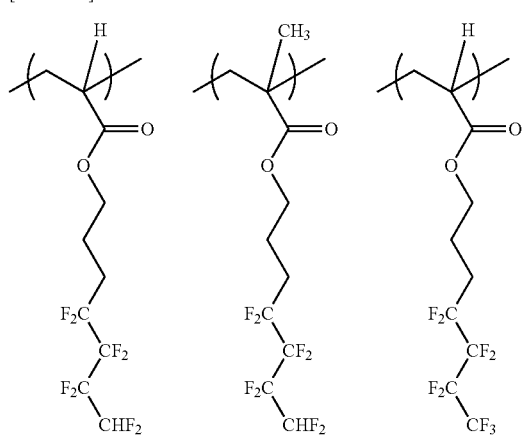

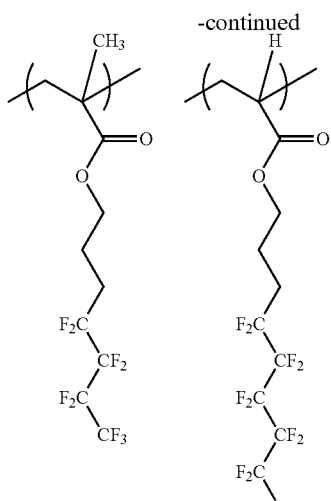
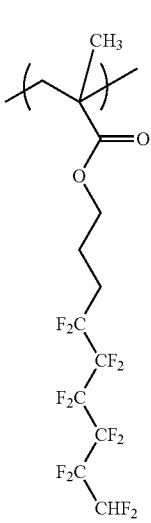
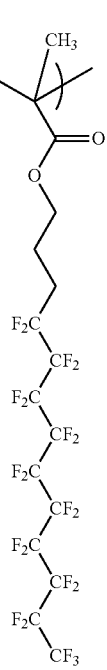
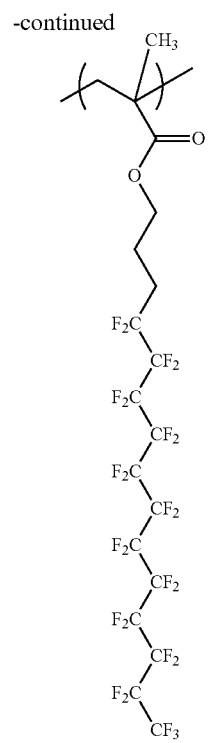

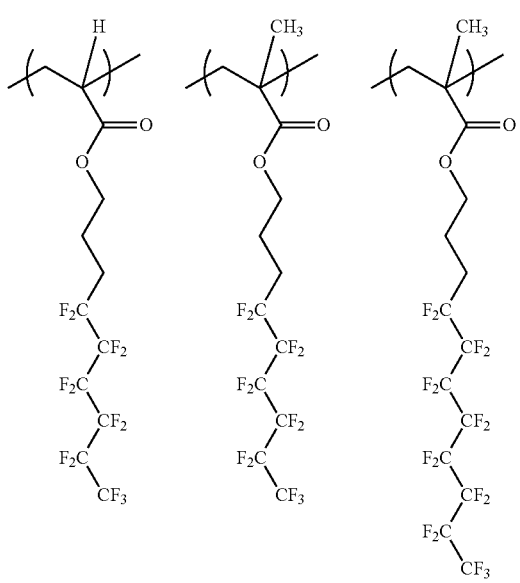

The amount of the repeating unit represented by the formula (5) is preferably 5 mass % or more and 70 mass % or less, more preferably 10 mass % or more and 50 mass % or less, particularly preferably 10 mass % or more and 30 mass % or less, relative to 100 mass % of the fluororesin.

When the amount of the repeating unit represented by the formula (5) is more than 70 mass %, the fluororesin tends to be poorly soluble in solvents.

The repeating unit represented by the formula (5) is a repeating unit that imparts ink repellency after UV-ozone treatment or oxygen plasma treatment. Thus, when it is desired to seek high ink repellency, preferably, the fluororesin contains a repeating unit represented by the formula (5).

The fluororesin may have a structure represented by the following formula (6).

[Chem. 24]

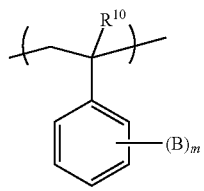

(6)

In the formula (6), $R^{10}$ represents a hydrogen atom or a methyl group.

In the formula (6), each B independently represents a hydrogen atom, a hydroxy group, a carboxy group, —C(=O)—O—$R^{11}$ ($R^{11}$ represents a C1-C15 linear, C3-C15 branched, or C3-215 cyclic alkyl group in which one or more hydrogen atoms in the alkyl group are substituted by fluorine atoms, and $R^{11}$ has a fluorine content of 30 mass % or more), or C(=O)—R$^{12}$ (R$^{12}$ represents a C1-C6 linear, C3-C6 branched, or C3-C6 cyclic alkyl group). m is an integer of 0 to 3.
The following are examples of preferred structures of the repeating unit represented by the formula (6).
[Chem. 25]
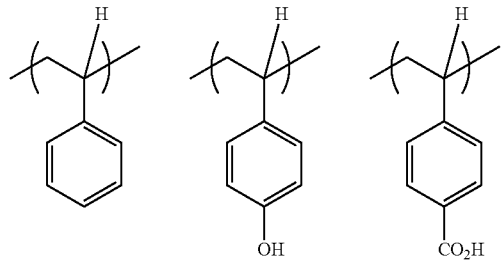
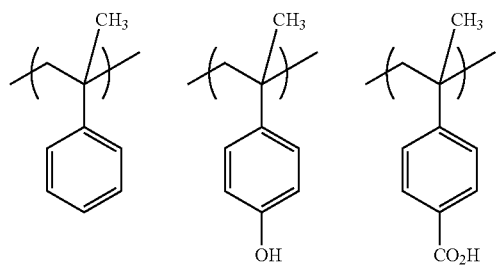
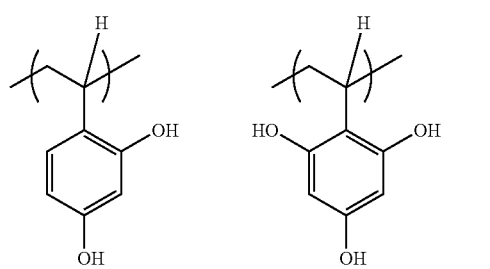
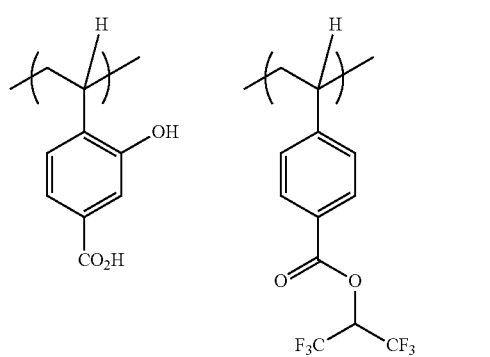
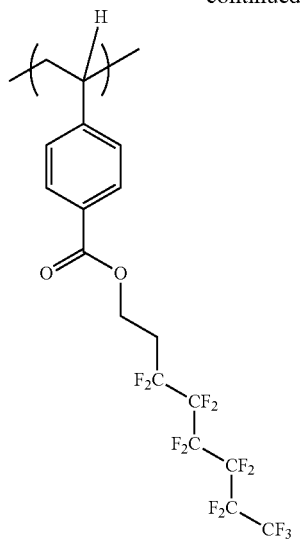
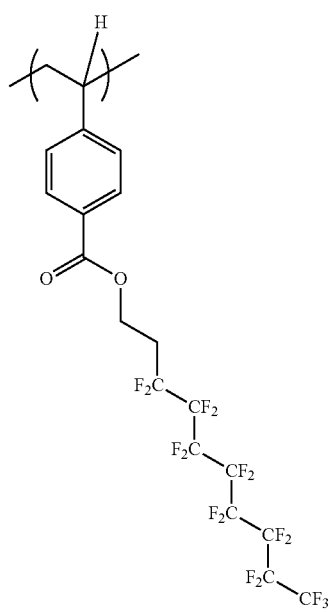
[Chem. 26]
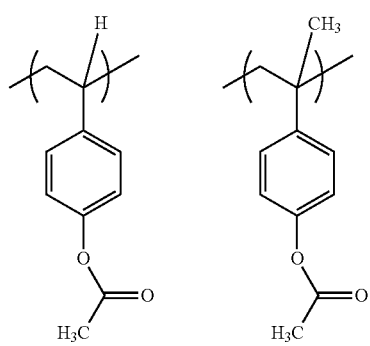

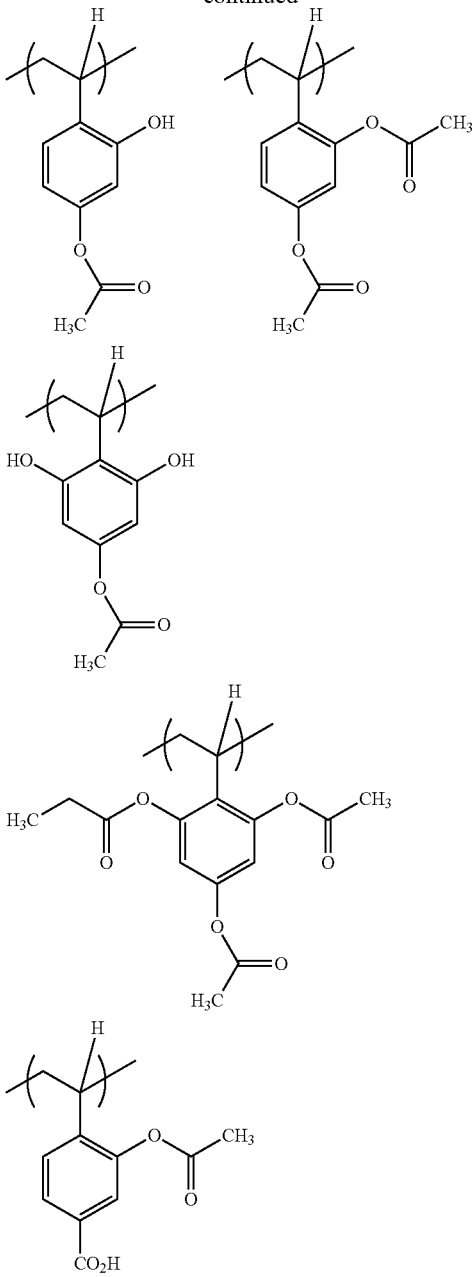

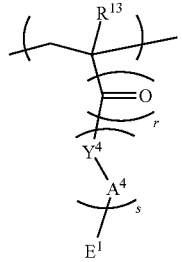

The amount of the repeating unit represented by the formula (6) is preferably 5 mass % or more and 70 mass % or less, more preferably 10 mass % or more and 50 mass % or less, particularly preferably 20 mass % or more and 40 mass % or less, relative to 100 mass % of the fluororesin.

When the amount of the repeating unit represented by the formula (6) is more than 70 mass %, the fluororesin tends to be poorly soluble in solvents.

A repeating unit represented by the formula (6) in which $B^1$ is a hydroxy group or a carboxy group is soluble in an alkali developer. Thus, when it is desired to impart solubility to a film obtainable from the fluororesin in an alkali developer, preferably, the fluororesin contains a repeating unit represented by the formula (6) in which $B^1$ is a hydroxy group or a carboxy group.

The fluororesin may have a structure represented by the following formula (7).

[Chem. 27]

(7)

In the formula (7), R represents a hydrogen atom or a methyl group.

In the formula (7), $A^4$ is a divalent linking group and represents a C1-C10 linear, 03-C10 branched, or C3-C10 cyclic alkylene group in which one or more hydrogen atoms in the alkylene group may be substituted by hydroxy groups or —O—C(=O)—CH$_3$.

When the divalent linking group $A^4$ is a C1-C10 linear alkylene group, examples thereof include a methylene group, an ethylene group, a propylene group, an n-butylene group, an n-pentylene group, an n-hexalene group, an n-heptalene group, an n-octalene group, an n-nonalene group, and an n-decalene group.

When the divalent linking group $A^4$ is a C3-C10 branched alkylene group, examples thereof include an isopropylene group, an isobutylene group, a sec-butylene group, a tert-butylene group, an isopentalene group, and an isohexalene group.

When the divalent linking group $A^4$ is a C3-C10 cyclic alkylene group, examples thereof include disubstituted cyclopropane, disubstituted cyclobutane, disubstituted cyclopentane, disubstituted cyclohexane, disubstituted cycloheptane, disubstituted cyclooctane, disubstituted cyclodecane, and disubstituted 4-tert-butylcyclohexane.

When one or more hydrogen atoms in these alkylene groups are substituted by hydroxy groups, examples of these hydroxy group-substituted alkylene groups include a 1-hydroxyethylene group (—CH(OH)CH$_2$—), a 2-hydroxyethylene group (—CH$_2$CH(OH)—), a 1-hydroxy-n-propylene group, a 2-hydroxy-n-propylene group, a hydroxy-isopropylene group (—CH(CH$_2$OH)CH—), a 1-hydroxy-n-butylene group, a 2-hydroxy-n-butylene group, a hydroxy-sec-butylene group (—CH(CH$_2$OH) CH$_2$CH$_2$—), a hydroxy-isobutylene group (—CH$_2$CH(CH$_2$OH)CH—), and a hydroxy-tert-butylene group (—C(CH$_2$OH) (CH$_3$)CH$_2$—).

When one or more hydrogen atoms in these alkylene groups are substituted by —O—C(=O)—CH$_3$, examples of these substituted-alkylene groups include those in which hydroxy groups of the hydroxy group-substituted alkylene groups exemplified above are substituted by —O—C(=O)—CH$_3$.

The divalent linking group $A^4$ is preferably a methylene group, an ethylene group, a propylene group, an n-butylene group, an isobutylene group, a sec-butylene group, a cyclohexyl group, a 1-hydroxyethylene group (—CH(OH) CH$_2$—), a 2-hydroxyethylene group (—CH$_2$CH(OH)—), a 2-hydroxy-n-propylene group, a hydroxy-isopropylene group (—CH(CH$_2$OH)CH$_2$—), a 2-hydroxy-n-butylene group, or a hydroxy-sec-butylene group (—CH(CH$_2$OH)

$CH_2CH_2$—), more preferably an ethylene group, a propylene group, a 1-hydroxyethylene group (—CH(OH)CH$_2$—), 2-hydroxyethylene group (—CH$_2$CH(OH)—), 2-hydroxy-n-propylene group, or hydroxy-isopropylene group (—CH(CH$_2$OH)CH$_2$—), particularly preferably an ethylene group, a 1-hydroxyethylene group (—CH(OH)CH$_2$—), or a 2-hydroxyethylene group (—CH$_2$CH(OH)—).

In the formula (7), $Y^4$ is a divalent linking group and represents —O— or —NH—, with —O— being more preferred.

In the formula (7), r represents 0 or 1. When r is 0, (—C(=O)—) represents a single bond.

In the formula (7), $E^1$ represents a hydroxy group, carboxy group or an oxirane group.

When $E^1$ is an oxirane group, examples thereof include an ethylene oxide group, a 1,2-propylene oxide group, and a 1,3-propylene oxide group. Preferred of these is an ethylene oxide group.

In the formula (7), s represents 0 or 1. When s is 0, (—$Y^4$-$A^4$-) represents a single bond. When r is 0 and s is 0, the structure has bonded to the main chain of the repeating unit.

The following are examples of preferred structures of the repeating unit represented by the formula (7).

[Chem. 28]

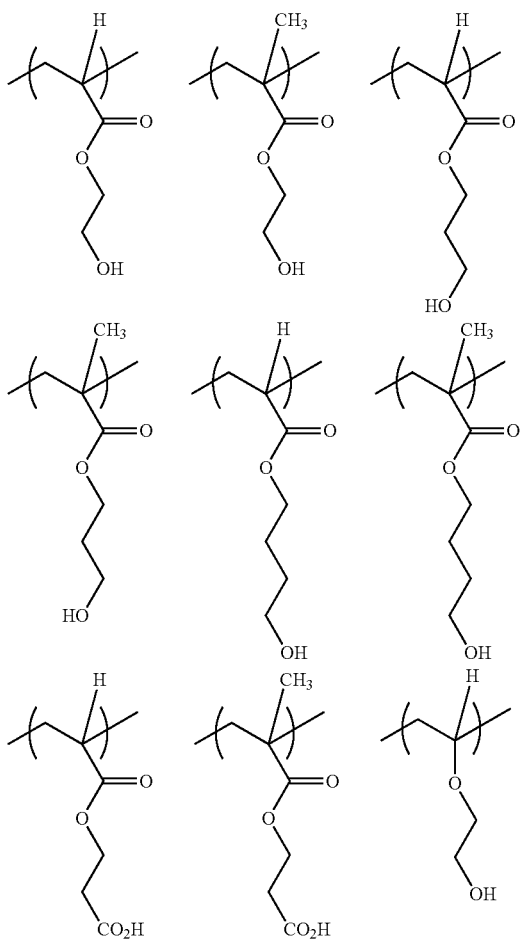
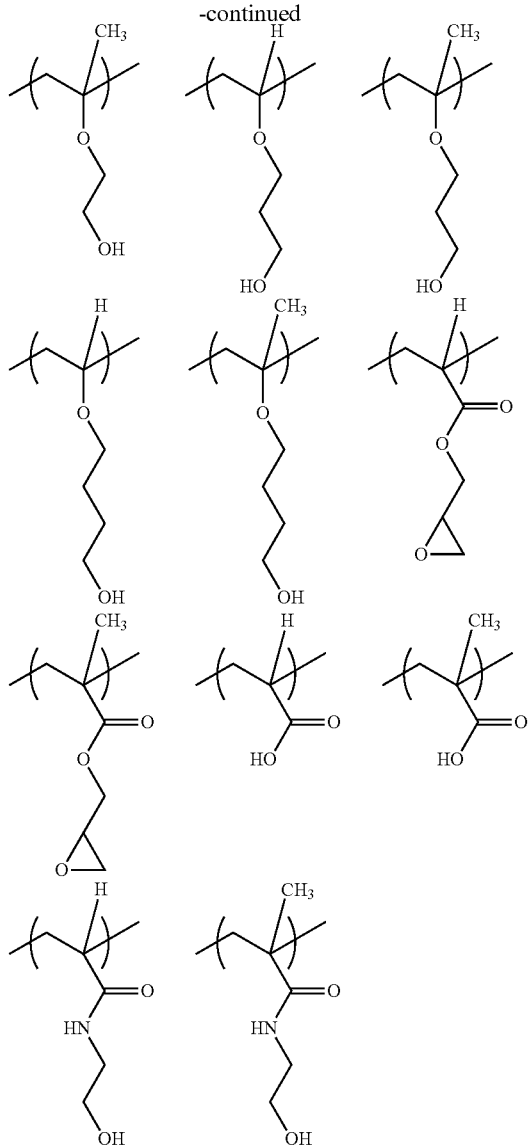

A repeating unit represented by the formula (7) in which $E^1$ is a hydroxy group or a carboxy group imparts solubility to the fluororesin in an alkali developer. Thus, when it is desired to impart alkali developability to a film obtainable from the fluororesin, preferably, the fluororesin contains a repeating unit represented by the formula (7) in which $E^1$ is a hydroxy group or a carboxy group.

The molecular weight of the fluororesin in terms of weight average molecular weight measured by gel permeation chromatography (GPC) using polystyrene as a standard substance is preferably 1,000 or more and 1,000,000 or less, more preferably 2,000 or more and 500,000 or less, particularly preferably 3,000 or more and 100,000 or less. When the molecular weight is less than 1,000, the resulting fluororesin film or banks for organic EL tend to have low strength. When the molecular weight is more than 1,000,000, it may be difficult to form a fluororesin film due to lack of solubility of the fluororesin in solvents.

The dispersity (Mw/Mn) is preferably 1.01 to 5.00, more preferably 1.01 to 4.00, particularly preferably 1.01 to 3.00.

The fluororesin may be a random copolymer, an alternating copolymer, a block copolymer, or a graft copolymer.

Preferably, the fluororesin is a random copolymer to suitably (not locally) disperse characteristics of each repeating unit.

The following are preferred embodiments of the fluororesin for use in the method of producing light-emitting elements of the present disclosure.

Embodiment 1

Fluororesin having repeating units represented by the following formulas (2) and (3)
Formula (2): $R^1$ and $R^2$ are hydrogen atoms; and each Rf is independently a fluorine atom, a difluoromethyl group, or a trifluoromethyl group.
Formula (3): $R^3$ and $R^4$ are hydrogen atoms; $W^1$ is —O—C(=O)—NH—, —C(=O)—O—C(=O)—NH—, or —C(=O)—NH—; A is an ethylene group; Y is —O—; and n is 1.

Embodiment 2

Fluororesin having repeating units represented by the following formulas (2) and (3)
Formula (2): same as described in Embodiment 1
Formula (3): $R^3$ and $R^4$ are hydrogen atoms; $W^1$ is —O—; $A^1$ is a 2-hydroxy-n-propylene group or a hydroxy-isopropylene group (—CH(CH$_2$OH)CH$_2$—); $Y^1$ is —O—; and n is 1.

Embodiment 3

Fluororesin having repeating units represented by the following formulas (2), (3), and (5-1)
Formula (2): same as described in Embodiment 1
Formula (3): same as described in Embodiment 1
Formula (5-1): $R^9$ is a methyl group; p is an integer of 2; q is an integer of 4 to 8; and X is a fluorine atom.

Embodiment 4

Fluororesin having repeating units represented by the following formulas (2), (3), (5-1), and (6)
Formula (2): same as described in Embodiment 1
Formula (3): same as described in Embodiment 1
Formula (5-1): same as described in Embodiment 3
Formula (6): $R^{10}$ is a hydrogen atom; B is a hydrogen atom, a hydroxy group, a carboxy group, or —O—C(=O)—CH; and m is 1.

Embodiment 5

Fluororesin having repeating units represented by the following formulas (2) and (4)
Formula (2): same as described in Embodiment 1
Formula (4): $R^5$ and $R^6$ are each independently a hydrogen atom or a methyl group; $W^2$ is —O—C(=O)—NH—, —C(=O)—O—C(=O)—NH—, or —C(=O)—NH—; $A^2$ and $A^3$ each independently an ethylene group; $Y^2$ and $Y^3$ are —O—; n is 1; and r is 1.

Embodiment 6

Fluororesin having repeating units represented by the following formulas (2) and (4)
Formula (2): same as described in Embodiment 1
Formula (4): $R^5$ and $R^2$ are each independently a hydrogen atom or a methyl group; $W^2$ is —O—C(=O)—NH—, —C(=O)—O—C(=O)—NH—, or —C(=O)—NH—; $A^2$ and $A^3$ are each independently an ethylene group, a 1-hydroxy-n-ethylene group (—CH(OH)CH$_2$—), or a 2-hydroxy-n-ethylene group (—CH$_2$CH(OH)—); $Y^2$ and $Y^3$ are —O—; n is 1; and r is 1.

Embodiment 7

Fluororesin having repeating units represented by the following formulas (2) and (4)
Formula (2): same as described in Embodiment 1
Formula (4): $R^5$ and $R^6$ are each independently a hydrogen atom or a methyl group; $W^2$ is —O—C(=O)—NH—, —C(=O)—O—C(=O)—NH—, or —C(=O)—NH—; $A^2$ and $A^3$ are each independently an ethylene group or a butyl group; $Y^2$ and $Y^3$ are —O—; n is 1; and r is 0.

Embodiment 8

Fluororesin having repeating units represented by the following formulas (2), (4), and (5-1)
Formula (2): same as described in Embodiment 1
Formula (4): same as described in Embodiment 5
Formula (5-1): same as described in Embodiment 3

Embodiment 9

Fluororesin having repeating units represented by the following formulas (2), (4), (5-1), and (7)
Formula (2): same as described in Embodiment 1
Formula (4): same as described in Embodiment 5
Formula (5-1): same as described in Embodiment 3
Formula (7): $R^{13}$ is a hydrogen atom; $A^4$ is an ethylene group; $Y^4$ is —O—; r is 1; s is 1; and $E^1$ is a hydroxy group or a carboxy group.

Embodiment 10

Fluororesin having repeating units represented by the following formulas (2), (4), (5-1), (6), and (7)
Formula (2): same as described in Embodiment 1
Formula (4): same (as described in Embodiment 5
Formula (5-1): same as described in Embodiment 3
Formula (6): same as described in Embodiment 4
Formula (7): same as described in Embodiment 9

Embodiment 11

Fluororesin having repeating units represented by the following formulas (4), (5-1), and (5)
Formula (4): same as described in Embodiment 5
Formula (5-1): same as described in Embodiment 3
Formula (5): $R^8$ is a hydrogen atom or a C3 branched alkyl group in which one or more hydrogen atoms in the alkyl group may be substituted by fluorine atoms.

Embodiment 12

Fluororesin having repeating units represented by the following formulas (4), (5-1), and (6)
Formula (4): same as described in Embodiment 5
Formula (5-1): same as described in Embodiment 3
Formula (6): same as described in Embodiment 4
The fluororesin has a fluorine content of preferably 20 to 50 mass %, more preferably 25 to 40 mass %.

The fluororesin having a fluorine content in the above ranges is easily soluble in solvents. The presence of fluorine atoms in the fluororesin results in a fluororesin film or banks having excellent ink repellency.

Herein, the fluorine content of the fluororesin can be calculated from properties measured by nuclear magnetic resonance (NMR) spectroscopy such as molar percentages of monomers constituting the fluororesin, molecular weights of monomers constituting the fluororesin, and amount of fluorine in each monomer.

The following describes a fluorine content measurement method, providing that the fluororesin is a resin derived from 1,1-bistrifluoromethylbutadiene, 4-hydroxystyrene, and 2-(perfluorohexyl)ethyl methacrylate.
 (i) First, the fluororesin is measured by NMR to calculate the percentage of each monomer (mol percentage).
 (ii) The molecular weight (Mw) of the monomer of the fluororesin is multiplied by the mol percentage, and the resulting values are added up to determine the total value. The weight percentage (wt %) of each monomer is calculated from the total value.

The molecular weight of 1,1-bistrifluoromethylbutadiene is 190, the molecular weight of 4-hydroxystyrene is 120, and the molecular weight of 2-(perfluorohexyl)ethyl methacrylate is 432.
 (iii) Next, the fluorine content of the monomer containing fluorine is calculated.
 (iv) For each monomer, "fluorine content in the monomer÷molecular weight (Mw) of the monomer× weight percentage (wt %)" is calculated, and the resulting values are added up.
 (v) The value obtained in (iv) above is divided by the total value obtained in (ii) above to calculate the fluorine content of the fluororesin.

(Solvent)

Any solvent may be used. Examples thereof include ketones, alcohols, polyhydric alcohols and their derivatives, ethers, esters, aromatic solvents, and fluorine solvents. These may be used alone or in combination of two or more thereof.

Specific examples of the ketones include acetone, methyl ethyl ketone, cyclopentanone, cyclohexanone, methyl isoamyl ketone, methyl isobutyl ketone, methyl isopentyl ketone, and 2-heptanone.

Specific examples of the alcohols include isopropanol, butanol, isobutanol, n-pentanol, isopentanol, tert-pentanol, 4-methyl-2-pentanol, 3-methyl-3-pentanol, 2,3-dimethyl-2-pentanol, n-hexanol, n-heptanol, 2-heptanol, n-octanol, n-decanol, s-amyl alcohol, t-amyl alcohol, isoamyl alcohol, 2-ethyl-1-butanol, lauryl alcohol, hexyl decanol, and oleyl alcohol.

Specific examples of the polyhydric alcohols and their derivatives include ethylene glycol, ethylene glycol monoacetate, ethylene glycol dimethyl ether, diethylene glycol, diethylene glycol dimethyl ether, diethylene glycol monoacetate, propylene glycol, propylene glycol monoacetate, propylene glycol monomethyl ether (PGME), propylene glycol monoethyl ether, propylene glycol monopropyl ether, propylene glycol monobutyl ether, propylene glycol monomethyl ether acetate (PGMEA), and monomethyl ether, monoethyl ether, monopropyl ether, monobutyl ether, and monophenyl ether of dipropylene glycol or dipropylene glycol monoacetate.

Specific examples of the ethers include diethyl ether, diisopropyl ether, tetrahydrofuran, dioxane, and anisole.

Specific examples of the esters include methyl lactate, ethyl lactate (EL), methyl acetate, ethyl acetate, butyl acetate, methyl pyruvate, ethyl pyruvate, methyl methoxypropionate, ethyl ethoxypropionate, and γ-butyrolactone.

Examples of the aromatic solvents include xylene and toluene.

Examples of the fluorine solvents include chlorofluorocarbons, hydrochlorofluorocarbons, perfluoro compounds, and hexafluoroisopropyl alcohol.

Other solvents such as terpene-based petroleum naphtha solvents and paraffinic solvents, which are high-boiling-point weak solvents, can also be used to improve coating properties.

Of these, preferably, the solvent is at least one selected from the group consisting of methyl ethyl ketone, cyclohexanone, methyl isoamyl ketone, 2-heptanone, ethylene glycol, ethylene glycol dimethyl ether, ethylene glycol monoacetate, diethylene glycol, diethylene glycol monoacetate, diethylene glycol dimethyl ether, propylene glycol, propylene glycol monoacetate, propylene glycol monomethyl ether (PGME), propylene glycol monomethyl ether acetate (PGMEA), dipropylene glycol, dipropylene glycol monoacetate monomethyl ether, dipropylene glycol monoacetate monoethyl ether, dipropylene glycol monoacetate monopropyl ether, dipropylene glycol monoacetate monobutyl ether, dipropylene glycol monoacetate monophenyl ether, 1,4-dioxane, methyl lactate, ethyl lactate, methyl acetate, ethyl acetate, butyl acetate, methyl methoxypropionate, ethyl ethoxypropionate, γ-butyrolactone, and hexafluoroisopropyl alcohol. More preferred are methyl ethyl ketone, propylene glycol monomethyl ether acetate (PGMEA), propylene glycol monomethyl ether (PGME), cyclohexanone, ethyl lactate, butyl acetate, and γ-butyrolactone.

The amount of the solvent is preferably 50 parts by mass or more and 2,000 parts by mass or less, more preferably 100 parts by mass or more and 1,000 parts by mass or less, relative to the concentration (100 parts by mass) of the fluororesin (when the photosensitive resin composition contains the later-described alkali-soluble resin, the concentration is the sum including the alkali-soluble resin). The thickness of the resulting resin film can be adjusted by adjusting the amount of the solvent. When the amount is in the above ranges, the resulting resin film has a thickness particularly suitable to obtain banks for organic EL.

(Photopolymerization Initiator)

Any known photopolymerization initiator can be used as long as it polymerizes a monomer having a polymerizable double bond by high energy rays such as electromagnetic waves or electron beams.

The photopolymerization initiator can be a photo-radical initiator or a photoacid initiator. These may be used alone or in combination with a photo-radical initiator and a photoacid initiator. Two or more photo-radical initiators or photoacid initiators may be mixed. Use of the photopolymerization initiator in combination with additives enables living polymerization in some cases. Known additives can be used.

Specifically, the photo-radical initiators can be classified into the following types, for example: the intramolecular cleavage type that cleaves the intermolecular bond by absorption of electromagnetic waves or electron beams to generate radicals; and the hydrogen extraction type that, when used in combination with a hydrogen donor such as a tertiary amine or ether, generates radicals. Either type can be used. A photo-radical initiator of a type different from those described above can also be used.

Specific examples of the photo-radical initiators include benzophenone-based, acetophenone-based, diketone-based, acylphosphine oxide-based, quinone-based, and acyloin-based photo-radical initiators.

Specific examples of the benzophenone-based photo-radical initiators include benzophenone, 4-hydroxybenzophenone, 2-benzoylbenzoic acid, 4-benzoylbenzoic acid, 4,4'-bis(dimethylamino)benzophenone, and 4,4'-bis(diethylamino)benzophenone. Preferred of these are 2-benzoylbenzoic acid, 4-benzoylbenzoic acid, and 4,4'-bis(diethylamino) benzophenone.

Specific examples of the acetophenone-based photo-radical initiators include acetophenone, 2-(4-toluenesulfonyloxy)-2-phenylacetophenone, p-dimethylaminoacetophenone, 2,2'-dimethoxy-2-phenylacetophenone, p-methoxyacetophenone, 2-methyl-[4-(methylthio)phenyl]-2-morphorino-1-propanone, and 2-benzyl-2-dimethylamino-1-(4-morphorinophenyl)-butan-1-one. Preferred of these are p-dimethylaminoacetophenone and p-methoxyacetophenone.

Specific examples of the diketone-based photo-radical initiators include 4,4'-dimethoxybenzyl, methyl benzoylformate, and 9,10-phenanthrenequinone. Preferred of these are 4,4'-dimethoxybenzyl and methyl benzoylformate.

Specific examples of the acylphosphine oxide-based photo-radical initiators include bis(2,4,6-trimethylbenzoyl)-phenylphosphine oxide.

Specific examples of the quinone-based photo-radical initiators include anthraquinone, 2-ethylanthraquinone, camphorquinone, and 1,4-naphthoquinone. Preferred of these are camphorquinone and 1,4-naphthoquinone.

Specific examples of the acyloin-based photo-radical initiators include benzoin, benzoin methyl ether, benzoin ethyl ether, and benzoin isopropyl ether. Preferred of these are benzoin and benzoin methyl ether.

Preferred are benzophenone-based, acetophenone-based, and diketone-based photo-radical initiators. More preferred are benzophenone-based photo-radical initiators.

Examples of preferred commercially available photo-radical initiators include Irgacure 127, Irgacure 184, Irgacure 369, Irgacure 651, Irgacure 819, Irgacure 907, Irgacure 2959, Irgacure OXE-01, Darocur 1173, and Lucirin TPO (trade names) available from BASF. More preferred of these are Irgacure 651 and Irgacure 369.

Specifically, the photoacid initiator is an onium salt of a pair of cation and anion, the cation being at least one selected from the group consisting of aromatic sulfonic acid, aromatic iodonium, aromatic diazonium, aromatic ammonium, thianthrenium, thioxanthonium, and (2,4-cyclopentadien-1-yl) (1-methylethylbenzene)-iron, the anion being at least one selected from the group consisting of tetrafluoroborate, hexafluorophosphate, hexafluoroantimonate, and pentafluorophenyl borate.

Particularly preferred of these are bis[4-(diphenylsulfonio)phenyl]sulfide bishexafluorophosphate, bis[4-(diphenylsulfonio)phenyl]sulfide tetrakis(pentafluorophenyl)borate, and diphenyliodonium hexafluorophosphate.

Examples of commercially available photoacid generators include CPI-100P, CPI-110P, CPI-101A, CPI-200K, and CPI-210S (trade names) available from San-Apro Ltd.; CYRACURE Photoinitiator UVI-6990, CYRACURE Photoinitiator UVI-6992, and CYRACURE Photoinitiator UVI-6976 (trade names) available from Dow Chemical Japan Limited; ADEKA OPTOMER SP-150, ADEKA OPTOMER SP-152, ADEKA OPTOMER SP-170, ADEKA OPTOMER SP-172, and ADEKA OPTOMER SP-300 (trade names) available from ADEKA; CI-5102 and CI-2855 (trade names) available from Nippon Soda Co., Ltd.; SAN AID SI-60L, SAN AID SI-80L, SAN AID SI-100L, SAN AID SI-110L, SAN AID SI-180L, SAN AID SI-110, and SAN AID SI-180 (trade names) available from Sanshin Chemical Industry Co. Ltd; Esacure 1064 and Esacure 1187 (trade names) available from Lamberti; and Irgacure 250 (trade name) available from Ciba Specialty Chemicals.

The amount of the photopolymerization initiator is 0.1 parts by mass or more and 30 parts by mass or less, more preferably 1 part by mass or more and 20 parts by mass or less, relative to 100 parts by mass of the fluororesin (when the photosensitive resin composition contains the later-described alkali-soluble resin, the concentration is the sum including the alkali-soluble resin). When the amount of the photopolymerization initiator is less than 0.1 parts by mass, the crosslinking effect tends to be insufficient. When the amount thereof is more than 30 parts by mass, the resolution and sensitivity tend to be low.

(Other components)

The photosensitive resin composition essentially contains a fluororesin, a solvent, and a photopolymerization initiator, and may further contain a crosslinking agent, an alkali-soluble resin, a naphthoquinonediazide group-containing compound, a basic compound, and other additives.

(Crosslinking Agent)

A crosslinking agent reacts with a repeating unit represented by the formula (3) or (4), whereby the resin can have a crosslinked structure. This can improve the mechanical strength of the resulting film.

A known crosslinking agent can be used. Specific examples thereof include compounds obtained by reacting an amino group-containing compound such as melamine, acetoguanamine, benzoguanamine, urea, ethylene urea, propylene urea, or glycoluril with formaldehyde or formaldehyde and a lower alcohol, and substituting a hydrogen atom of the amino group by a hydroxymethyl group or a lower alkoxymethyl group; polyfunctional epoxy compounds; polyfunctional oxetane compounds; polyfunctional isocyanate compounds; and polyfunctional acrylate compounds. Here, those that use melamine are referred to as melamine-based crosslinking agents, those that use urea are referred to as urea-based crosslinking agents, those that use alkylene urea such ethylene urea or propylene urea are referred to as alkylene urea-based crosslinking agents, and those that use glycoluril are referred to as glycoluril-based crosslinking agents. These crosslinking agents may be used alone or in combination of two or more thereof.

Preferably, the crosslinking agent is at least one selected from these crosslinking agents. Particularly preferred are glycoluril-based crosslinking agents and polyfunctional acrylate compounds.

Examples of the melamine-based crosslinking agents include hexamethoxymethyl melamine, hexaethoxymethyl melamine, hexapropoxymethyl melamine, and hexabutoxybutyl melamine. Preferred of these is hexamethoxymethyl melamine.

Examples of the urea-based crosslinking agents include bismethoxymethylurea, bisethoxymethylurea, bispropoxymethylurea, and bisbutoxymethylurea. Preferred of these is bismethoxymethylurea.

Examples of the alkylene urea-based crosslinking agents include ethylene urea-based crosslinking agents such as mono- and/or di-hydroxymethylated ethylene urea, mono- and/or di-methoxymethylated ethylene urea, mono- and/or di-ethoxymethylated ethylene urea, mono- and/or di-propoxymethylated ethylene urea, and mono- and/or di-butoxymethylated ethylene urea; propylene urea-based crosslinking agents such as mono- and/or di-hydroxymethylated propylene urea, mono- and/or di-methoxymethylated propylene urea, mono- and/or di-ethoxymethylated propylene urea, mono- and/or di-propoxymethylated propylene urea, and mono- and/or di-butoxymethylated propylene urea; 1,3-di(methoxymethyl)-4,5-dihydroxy-2-imidazolidinone; and 1,3-di(methoxymethyl)-4,5-dimethoxy-2-imidazolidinone.

Examples of the glycoluril-based crosslinking agents include mono-, di-, tri-, and/or tetra-hydroxymethylated glycoluril; mono-, di-, tri-, and/or tetra-methoxymethylated glycoluril; mono-, di-, tri-, and/or tetra-ethoxymethylated glycoluril; mono-, di-, tri-, and/or tetra-propoxymethylated glycoluril; and mono-, di-, tri-, and/or tetra-butoxymethylated glycoluril.

Examples of the polyfunctional acrylate compounds include polyfunctional acrylates (e.g., A-TMM-3, A-TMM-3L, A-TMM-3LM-N, A-TMPT, and AD-TMP (trade names) available from Shin-Nakamura Chemical Co., Ltd.); polyethylene glycol diacrylates (e.g., A-200, A-400, and A-600 (trade names) available from Shin-Nakamura Chemical Co., Ltd.); urethane acrylates (e.g., UA-122P, UA-4HA, UA-6HA, UA-6LPA, UA-11003H, UA-53H, UA-4200, UA-200PA, UA-33H, UA-7100, and UA-7200 (trade names) available from Shin-Nakamura Chemical Co., Ltd.); and pentaerythritol tetraacrylate.

The following are examples of preferred polyfunctional acrylate compounds.

[Chem. 29]

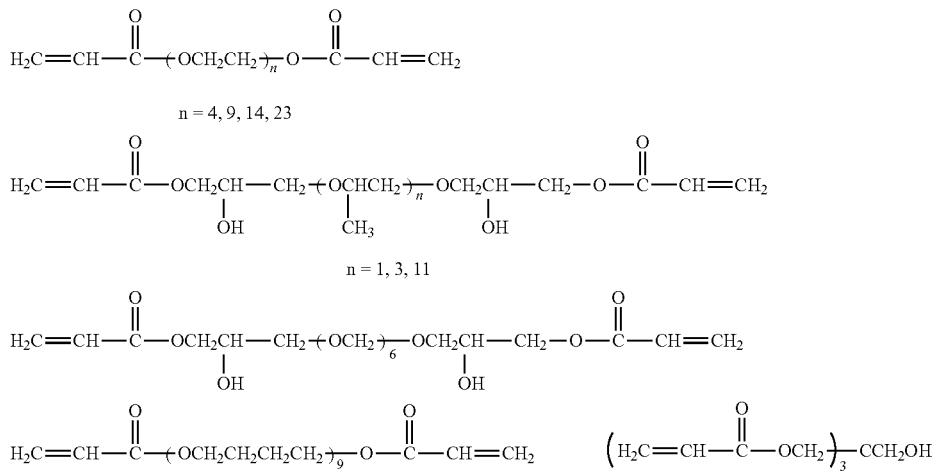

[Chem. 30]

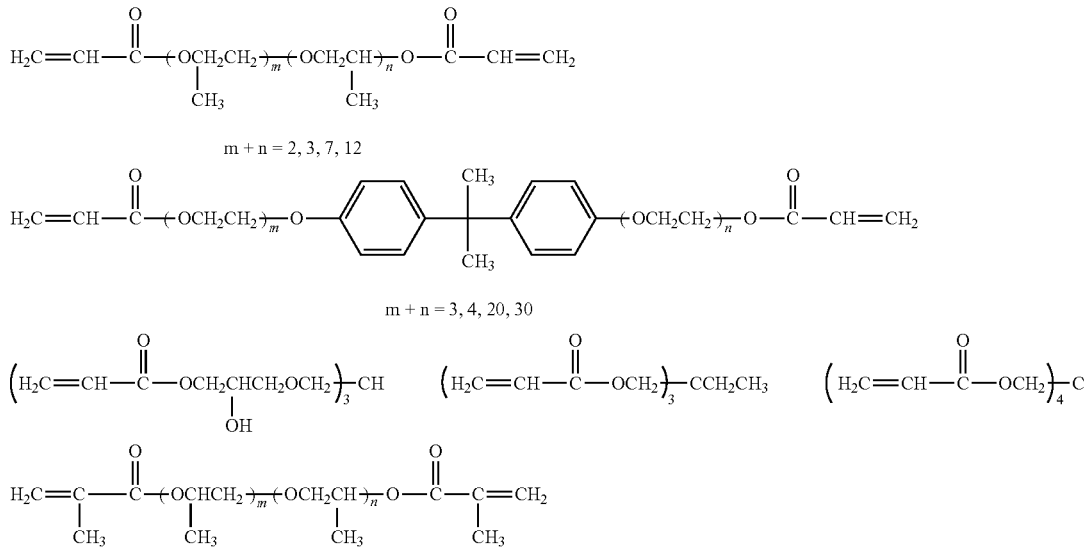

[Chem. 31]

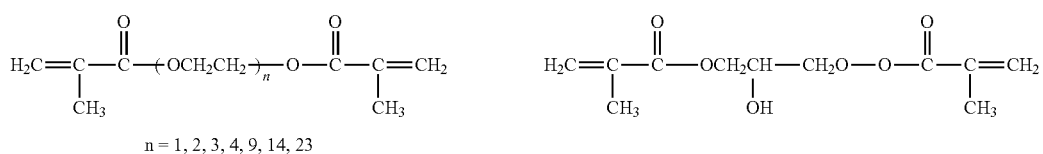

-continued

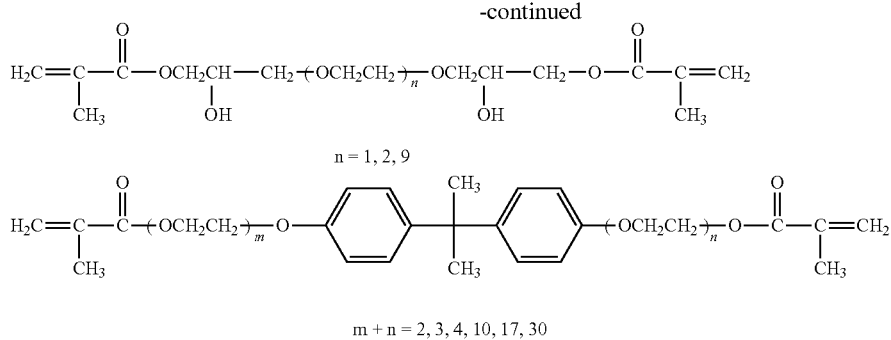

The amount of the crosslinking agent is preferably 10 parts by mass or more and 300 parts by mass or less, more preferably 50 parts by mass or more and 200 parts by mass or less, relative to 100 parts by mass of the fluororesin (when the photosensitive resin composition contains the later-described alkali-soluble resin, the concentration is the sum including the alkali-soluble resin). When the amount of the crosslinking agent is less than 10 parts by mass, the crosslinking effect tends to be insufficient. When the amount thereof is more than 300 parts by mass, the resolution and sensitivity tend to be low.

(Alkali-Soluble Resin)

When the photosensitive resin composition contains an alkali-soluble resin, it is possible to improve the shape of banks obtainable from the photosensitive resin composition.

Examples of the alkali-soluble resin include alkali-soluble novolac resins.

Alkali-soluble novolac resins can be obtained by condensation of phenol with aldehyde in the presence of an acid catalyst.

Specific examples of the phenol include phenol, o-cresol, m-cresol, p-cresol, 2,3-dimethylphenol, 2,4-dimethylphenol, 2,5-dimethylphenol, 3,4-dimethylphenol, 3,5-dimethylphenol, 2,3,5-trimethylphenol, 3,4,5-trimethylphenol, resorcinol, 2-methylresorcinol, 4-ethylresorcinol, hydroquinone, methylhydroquinone, catechol, 4-methyl-catechol, pyrogallol, phloroglucinol, thymol, and isothymol. These phenols may be used alone or in combination of two or more thereof.

Specific examples of the aldehyde include formaldehyde, trioxane, paraformaldehyde, benzaldehyde, acetaldehyde, propylaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, nitrobenzaldehyde, furfural, glyoxal, glutaraldehyde, terephthalaldehyde, and isophthalaldehyde.

Specific examples of the acid catalyst include hydrochloric acid, nitric acid, sulfuric acid, phosphoric acid, phosphorous acid, formic acid, oxalic acid, acetic acid, methanesulfonic acid, diethyl sulfate, and p-toluenesulfonic acid. These acid catalysts may be used alone or in combination of two or more thereof.

Other examples of the alkali-soluble resin include acid-modified epoxy acrylic resins. Examples of commercially available acid-modified epoxy acrylic resins include CCR-1218H, CCR-1159H, CCR-1222H, CCR-1291H, CCR-1235, PCR-1050, TCR-1335H, UXE-3024, ZAR-1035, ZAR-2001H, ZFR-1185, and ZCR-1569H (trade names) available from Nippon Kayaku Co., Ltd.

The weight average molecular weight of the alkali-soluble resin is preferably 1,000 to 50,000 in terms of developability and resolution of the photosensitive resin composition.

The amount of the alkali-soluble resin in the photosensitive resin composition is preferably 500 parts by mass or more and 10,000 parts by mass or less, more preferably 1,000 parts by mass or more and 7,000 parts by mass or less, relative to 100 parts by mass of the fluororesin. When the amount of the alkali-soluble resin is more than 10,000 parts by mass, the fluororesin tends to have insufficient ink repellency after UV-ozone treatment or oxygen plasma treatment.

(Naphthoquinonediazide Group-Containing Compound)

When the photosensitive resin composition contains a naphthoquinonediazide group-containing compound, it is possible to improve the shape of banks obtainable from the photosensitive resin composition.

Any naphthoquinonediazide group-containing compound can be used, and one commonly used as a photosensitive component of a resist composition for i-rays can be used.

Specific examples of the naphthoquinonediazide group-containing compound include a naphthoquinone-1,2-diazide-4-sulfonate compound, a naphthoquinone-1,2-diazide-5-sulfonate compound, a naphthoquinone-1,2-diazide-6-sulfonate compound, a naphthoquinone-1,2-diazide sulfonate compound, an orthobenzoquinonediazide sulfonate compound, and an orthoanthraquinonediazide sulfonate compound. Preferred of these are a naphthoquinone-1,2-diazide-4-sulfonate compound, a naphthoquinone-1,2-diazide-5-sulfonate compound, and a naphthoquinone-1,2-diazide-6-sulfonate compound, because they have excellent solubility. These compounds may be used alone or in combination of two or more thereof.

The amount of the naphthoquinonediazide group-containing compound in the photosensitive resin composition is preferably 10 parts by mass to 60 parts by mass, more preferably 20 parts by mass to 50 parts by mass relative to 100 parts by mass of the fluororesin (when the photosensitive resin composition contains the above-described alkali-soluble resin, the concentration is the sum including the alkali-soluble resin). When the amount thereof is more than 60 parts by weight, the resulting photosensitive resin composition tends to lack sensitivity.

(Basic Compound)

A basic compound functions to decrease the diffusion rate of an acid generated by the photoacid generator when the acid is diffused into a film of the photosensitive resin composition.

The presence of a basic compound makes it possible to adjust the acid diffusion distance and improve the shape of banks.

The presence of a basic compound also makes it possible to stably form banks with desired accuracy because the banks are less likely to be deformed even when the banks formed are left to stand for a long time before exposure.

Examples of the basic compound include aliphatic amines, aromatic amines, heterocyclic amines, and aliphatic polycyclic amines. Preferred of these are aliphatic amines. Specific examples thereof include secondary aliphatic amines, tertiary aliphatic amines, and alkyl alcohol amines. These basic compounds may be used alone or in combination of two or more thereof.

Examples of the aliphatic amines include alkylamines and alkyl alcohol amines each in which at least one hydrogen atom of ammonia ($NH_3$) is substituted by a C12 or lower alkyl group or a hydroxyalkyl group. Specific examples thereof include trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decanylamine, tri-n-dodecylamine, dimethylamine, diethylamine, di-n-propylamine, di-n-butylamine, di-n-pentylamine, di-n-hexylamine, di-n-heptylamine, di-n-octylamine, di-n-nonylamine, di-n-decanylamine, di-n-dodecylamine, dicyclohexylamine, methylamine, ethylamine, n-propylamine, n-butylamine, n-pentylamine, n-hexylamine, n-heptylamine, n-octylamine, n-nonylamine, n-decanylamine, n-dodecylamine, diethanolamine, triethanolamine, diisopropanolamine, triisopropanolamine, di-n-octanolamine, and tri-n-octanolamine.

Preferred of these are dialkylamine, trialkylamine, and alkyl alcohol amines. More preferred are alkyl alcohol amines. Particularly preferred of these alkyl alcohol amines are triethanolamine and triisopropanolamine.

Examples of the aromatic amines and heterocyclic amines include aniline and aniline derivatives such as N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine; heterocyclic amines such as 1,5-diazabicyclo[4.3.0]non-5-en, 1,8-diazabicyclo[5.4.0]undec-7-en, 1,4-diazabicyclo[2.2.2]octane, pyridine, bipyridine, 4-dimethylaminopyridine, hexamethylenetetramine, and 4,4-dimethylimidazoline; hindered amines such as bis(1,2,2,6,6-pentamethyl-4-piperidyl)sebacate; alcoholic nitrogen-containing compounds such as 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, and 1-[2-(2-hydroxyethoxy) ethyl]piperazine; and picoline, lutidine, pyrrole, piperidine, piperazine, indole, hexamethylenetetramine, and the like.

The amount of the basic compound in the photosensitive resin composition is preferably 0.001 parts by mass to 2 parts by mass, more preferably 0.01 parts by mass to 1 part by mass, relative to 100 parts by mass of the fluororesin (when the photosensitive resin composition contains the above-described alkali-soluble resin, the concentration is the sum including the alkali-soluble resin). When the amount of the basic compound is less than 0.001 parts by mass, the effect thereof as an additive tends to be insufficient. When the amount thereof is more than 2 parts by mass, the resolution and sensitivity tend to be low.

(Other Additives)

The photosensitive resin composition may contain other additives if necessary, as long as the effect of the photosensitive resin composition is not impaired. Examples of the other additives include various additives such as dissolution inhibitors, plasticizers, stabilizers, colorants, surfactants, thickeners, leveling agents, defoamers, compatibility agents, adhesives, and antioxidants.

These other additives may be known ones.

The colorant may be a pigment or a dye. Multiple colorants may be used if necessary. The pigment is preferably an organic pigment.

The colorant is not limited. Any publicly known colorant, such as perylene pigments, lactam pigments, azo pigments, phthalocyanine pigments, carbon pigments (e.g., carbon black), or metal oxide pigments (e.g., iron black or titanium oxide) can be used.

Preferably, the surfactant contains one or more of fluorine-based surfactants and silicone-based surfactants (fluorine-based surfactants, silicone-based surfactants, and surfactants containing both fluorine atoms and silicon atoms).

<Baking>

Next, the resulting patterned fluororesin film is cured by baking at a temperature of 200° C. or lower.

Thus, the patterned fluororesin film can be formed into banks.

The baking temperature is preferably 140° C. or lower, more preferably 100° C. or lower.

Baking at such a temperature enables curing of the patterned fluororesin film without significant damage to the first light-emitting element.

The baking time is preferably 10 to 120 minutes.

In the baking, UV-ozone treatment or oxygen plasma treatment may be performed after the patterned fluororesin film is cured. Of these, UV-ozone treatment is preferred.

With this treatment, residual organic matter in recesses of the patterned fluororesin film can be removed, and uneven wetting of the ink dropped is reduced. This can prevent defects in display elements.

Further, the method of producing a light-emitting element of the present disclosure may include forming a second light emitting layer that emits light using light from the first light emitting layer as excitation light in the region partitioned by the patterned fluororesin film.

Preferably, the second light emitting layer is formed after the baking.

Preferably, the second light emitting layer contains a conventionally known material such as a quantum dot light emitting material.

The light-emitting element of the present disclosure can be produced by the above steps.

The produced light-emitting element can be used as a light-emitting element for quantum dot display.

EXAMPLES

The present disclosure is described in further detail below with reference to examples, but the present disclosure is not limited to these examples.

1. Synthesis of Monomers

[Synthesis Example 1] Synthesis of 1,1-bistrifluoromethylbutadiene (BTFBE)

A 1000-ml glass flask equipped with a stirrer was charged with concentrated sulfuric acid (400 g) and heated to 100° C. Then, 1,1,1-trifluoro-2-trifluoromethyl-4-penten-2-ol (300 g) was gradually dropped thereto over one hour. After dropping, the mixture was stirred at 100° C. for 60 minutes. No residual raw materials were detected by $^{19}$F-NMR analysis of the reaction solution. Then, a fraction at 68° C. to 70° C. was collected by atmospheric distillation from the reaction solution, whereby 1,1-bistrifluoromethylbutadiene (hereinafter described as BTFBE) was obtained with a yield of 56%.

Presumably, the following chemical reaction occurred in this reaction.

[Chem. 32]

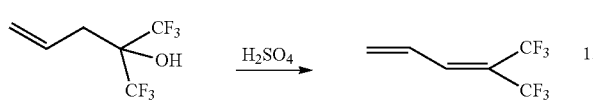

<Results of NMR Analysis>

The following results were obtained by NMR analysis of the STEPS synthesized.

$^1$H-NMR (solvent: deuterated chloroform; standard substance: TMS); δ (ppm) 5.95 (1H, dd) 6.05 (1H, dd), 6.85 (1H, m), 7.04 (1H, m)

$^{19}$F-NMR (solvent: deuterated chloroform, standard substance: C$_6$D$_6$); δ (ppm) −65.3 (3F, m), −58.4 (35, m)

[Synthesis Example 2] Synthesis of 4-hydroxystyrene (p-HO-St)

p-Acetoxystyrene (a product of Tokyo Chemical Industry Co., Ltd., hereinafter described as p-AcO-St) (100 g) and methanol (300 g) were mixed in a 1000-ml glass flask equipped with a stirrer at room temperature (about 20° C.), and 1,3,5-trihydroxybenzene (0.50 g; equivalent to 0.5 mass % of p-AcO-St) as a polymerization inhibitor was added to the mixture. Then, after the solution was cooled to 0° C. in an ice bath, a sodium hydroxide aqueous solution at a concentration of 12 mass % (corresponding to 1.0 equivalent of p-AcO-St) was gradually dropped over 40 minutes, followed by stirring at 0° C. for 30 minutes. No residual raw materials were detected by $^1$H-NMR analysis of the reaction solution. Then, a hydrochloric acid aqueous solution at a concentration of 18 mass % (corresponding to 0.8 equivalents of p-AcO-St) was dropped over 30 minutes, followed by stirring for 30 minutes. The pH of the solution was measured to be 6.

The resulting reaction solution was subjected to extraction with methyl-t-butylether (360 g) at room temperature (about 20° C.), followed by washing twice with purified water (330 g). To the resulting organic layer was added 1,3,5-trihydroxybenzene in an amount equivalent to 1 mass % of 4-hydroxystyrene. Subsequently, 4-hydroxystyrene was concentrated to 72 mass %, and added to n-octane (a poor solvent) cooled to 0° C. Then, the solution was placed in an ice bath and stirred for one hour to precipitate crystals of 4-hydroxystyrene. The crystals were filtered and further washed with n-octane. Then, the crystals were vacuum dried at 25° C. Thus, white crystals of 4-hydroxystyrene (hereinafter described as p-HO-St) were obtained (yield: 66%).

Presumably, the following chemical reaction occurred in this reaction.

[Chem. 33]

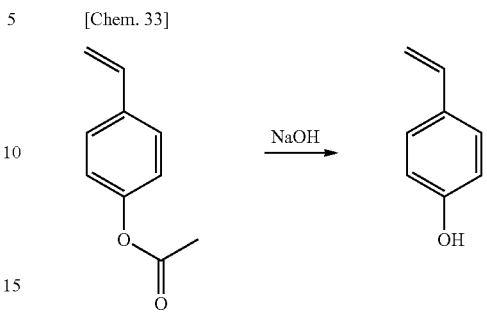

2. Production of Fluororesin (First Step: Polymerization)

[Measurement of Molar Ratio of Repeating Units] NMR

The molar ratio of the repeating units of the polymer was determined from the measurements of $^1$H-NMR, $^{19}$F-NMR, or $^{13}$C-NMR.

[Measurement of Polymer Molecular Weight] GPC

The weight average molecular weight Mw and the molecular weight dispersity (Mw/Mn: ratio of the weight average molecular weight Mw to the number average molecular weight Mn) of the polymer were measured by a high-speed gel permeation chromatograph (hereinafter sometimes referred to as GPC; model: HLC-8320 GPC available from Tosoh Corporation) with an ALPHA-M column and an ALPHA-2500 column (both available from Tosoh Corporation) connected in series, using tetrahydrofuran (THE) as a developing solvent and polystyrene as a standard substance. A refractive index difference detector was used.

2-1. Polymerization of Fluororesin Precursors

[Synthesis of Fluororesin Precursor 1]

To a 300-ml glass flask equipped with a stirrer was were added BTFBE obtained in Synthesis Example 1 (9.5 g (0.05 mol)), 2-hydroxyethyl methacrylate (a product of Tokyo Chemical Industry Co., Ltd., hereinafter described as HEMA) (13.1 g (0.10 mol)), 2-(perfluorohexyl)ethyl methacrylate (a product of Tokyo Chemical Industry Co., Ltd., hereinafter described as MA-C6F) (43.2 g (0.1 mol)), p-HO-St obtained in Synthesis Example 2 (9.0 g (0.075 mol)), and MEK (70 g) at room temperature (about 20° C.) Then, 2,2'-azobis(2-methylbutyronitrile) (a product of Tokyo Chemical industry Co., Ltd., hereinafter described as AIBN) (1.6 g (0.005 mol)) was added thereto, followed by degassing with stirring. Subsequently, the flask was purged with nitrogen gas, and the temperature inside the flask was raised to 75° C. for reaction for six hours. n-Heptane (380 g) was dropped into the reaction system, whereby a transparent viscous substance was precipitated. This viscous substance was isolated by decantation. Vacuum drying was performed at 60° C. Thus, a fluororesin precursor 1 as a transparent viscous substance was obtained (67 g; yield: 90%).

<Results of NMR Measurement>

The fluororesin precursor 1 was analyzed by NMR. The ratio (molar ratio) of "Repeating units of the fluororesin precursor 1" below was as follows: BTFBE repeating unit: HEMA repeating unit:MA-C6F repeating unit:p-HO-St repeating unit=20:28:30:22.

[Chem. 34]

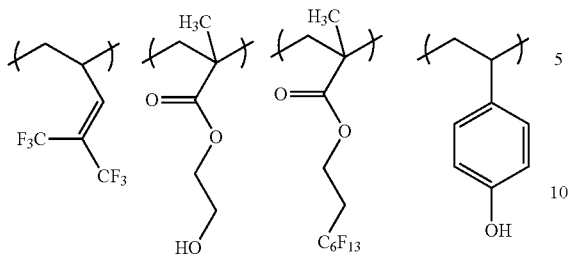

Repeating units of fluororesin precursor 1

Repeating Units of Fluororesin Precursor 1
<Results of GPC Measurement>

The fluororesin precursor 1 was measured by GPC. The results showed that Mw was 6700, and Mw/Mn was 1.3.
[Synthesis of Fluororesin Precursor 2]

The same procedure as the synthesis of the fluororesin precursor 1 was performed, except that p-HO-St was replaced by vinyl benzoic acid (a product of Tokyo Chemical Industry Co., Ltd., hereinafter described as VBA). Thus, a fluororesin precursor 2 containing the following repeating units was obtained (yield: 91%).
<Results of NMR Measurement>

The fluororesin precursor 2 was analyzed by NMR. The ratio (molar ratio) of "Repeating units of fluororesin precursor 2" below was as follows: BTFBE repeating unit: HEMA repeating unit:MA-C6F repeating unit:VBA repeating unit=19:27:31:23.

[Chem. 35]

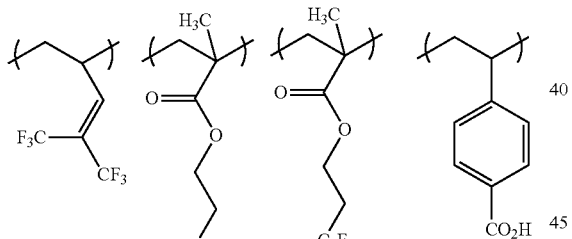

Repeating units of fluororesin precursor 2

Repeating Units of Fluororesin Precursor 2
<Results of GPC Measurement>

The fluororesin precursor 2 was measured by GPC. The results showed that Mw was 6,900 and Mw/Mn was 1.3.
[Synthesis of Fluororesin Precursor 3]

The same procedure as the synthesis of the fluororesin precursor 1 was performed, except that p-HO-St was replaced by p-acetoxystyrene (a product of Tokyo Chemical Industry Co., Ltd., hereinafter described as p-AcO-St). Thus, a fluororesin precursor 3 containing the following repeating units was obtained (yield: 88%).
<Results of NMR Measurement>

The fluororesin precursor 3 was analyzed by NMR. The ratio (molar ratio) of "Repeating units of fluororesin precursor 3" below was as follows: BTFBE repeating unit: HEMA repeating unit:MA-C6F repeating unit:p-AcO-St repeating unit=15:33:30:22.

[Chem. 36]

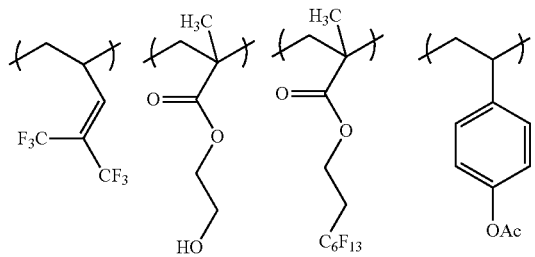

Repeating units of fluororesin precursor 3

Repeating Units of Fluororesin Precursor 3
<Results of GPC Measurement>

The fluororesin precursor 3 was measured by GPC. The results showed that Mw was 7,100 and Mw/Mn was 1.3.
[Synthesis of Fluororesin Precursor 4]

The same procedure as the synthesis of the fluororesin precursor 1 was performed, except that p-HO-St was replaced by styrene (a product of Tokyo Chemical Industry Co., Ltd., hereinafter described as St). Thus, a fluororesin precursor 4 containing the following repeating units was obtained (yield: 90%).
<Results of NMR Measurement>

The fluororesin precursor 4 was analyzed by NMR. The ratio (molar ratio) of "Repeating units of fluororesin precursor 4" below was as follows: BTFBE repeating unit: HEMA repeating unit:MA-C6F repeating unit:St repeating unit=16:34:29:21.

[Chem. 37]

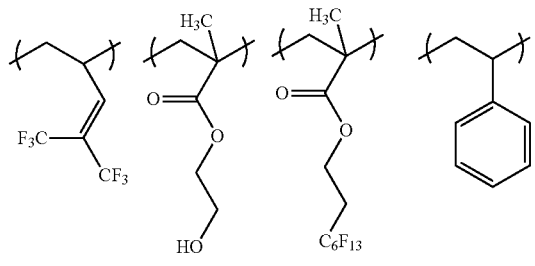

Repeating units of fluororesin precursor 4

Repeating Units of Fluororesin Precursor 4
<Results of GPC Measurement>

The fluororesin precursor 4 was measured by GPC. The results showed that Mw was 7,400 and Mw/Mn was 1.3.
[Synthesis of Fluororesin Precursor 5]

To a 300-ml glass flask equipped with a stirrer were added HEMA (13.01 g (0.1 mol)), MA-C6F (43.2 g (0.1 mol)), hexafluoro-2-propyl methacrylate (HFIP-M) (23.6 g (0.1 mol)), methyl methacrylate (MAA) (8.66 g (0.1 mol)), and MEK (88 g) at room temperature. Then, AIBN (1.6 g (0.010 mol)) was added thereto, followed by degassing with stirring. Subsequently, the flask was purged with nitrogen gas, and the temperature inside the flask was raised to 80° C., followed by reaction for six hours. The reaction solution after the reaction was dropped into n-heptane (530 g), whereby a white precipitate was obtained. The precipitate was filtered and vacuum dried at 60° C., whereby a fluororesin precursor 5 as a white solid was obtained (60 g; yield: 66%).

<Results of NMR Measurement>

The fluororesin precursor 5 was analyzed by NMR. The ratio (molar ratio) of "Repeating units of fluororesin precursor 5" below was as follows: HEMA repeating unit:MA-C6F repeating unit:HFIP-M repeating unit:MAA repeating unit=25:25:24:26.

[Chem. 38]

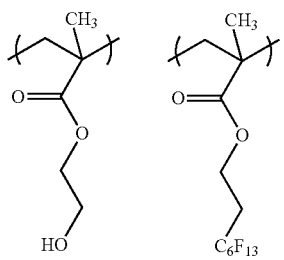

Repeating units of fluororesin precursor 5

Repeating Units of Fluororesin Precursor 5
<Results of GPC Measurement>

The fluororesin precursor 5 was measured by GPC. The results showed that Mw was 10,300 and Mw/Mn was 1.4.

[Synthesis of Fluororesin Precursor 6]

To a 300-ml glass flask equipped with a stirrer were added HEMA (13.1 g (0.10 mol)), MA-C6F (43.2 g (0.10 mol)), VBA (11.1 g (0.075 mol)), and MEK (75 g) at room temperature (about 20° C.). Then, 2,2'-azobis(2-methylbutyronitrile) (a product of Tokyo Chemical Industry Co., Ltd., hereinafter described as AIBN) (1.6 g (0.005 mol)) was added thereto, followed by degassing with stirring. Subsequently, the flask was purged with nitrogen gas, and the temperature inside the flask was raised to 75° C. for reaction for six hours. n-Heptane (400 g) was dropped into the reaction system, whereby a transparent viscous substance was precipitated. This viscous substance was isolated by decantation. Vacuum drying was performed at 60° C. Thus, a fluororesin precursor 6 as a transparent viscous substance was obtained (56 g; yield: 83%).

<Results of NMR Measurement>

The fluororesin precursor 6 was analyzed by NMR. The ratio (molar ratio) of "Repeating units of fluororesin precursor 6" below was as follows: HEMA repeating unit:MA-C6F repeating unit:VBA repeating unit=33:32:35.

[Chem. 39]

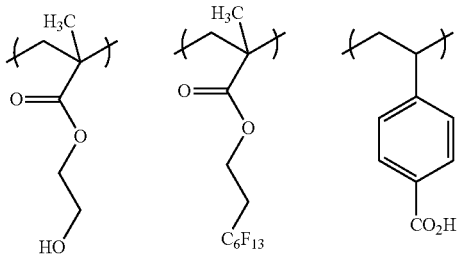

Repeating units of fluororesin precursor 6

Repeating Units of Fluororesin Precursor 6
<Results of GPC Measurement>

The fluororesin precursor 6 was measured by GPC. The results showed that Mw was 14,300 and Mw/Mn was 1.6.

2-2. Synthesis of Comparative Fluororesin Precursor

Comparative Polymerization Example 1

To a 300-ml glass flask equipped with a stirrer were added HEMA (13.1 g (0.10 mol)), MA-C6F (43.2 g (0.1 mol)), normal-butyl methacrylate (hereinafter abbreviated as MA-nBu) (14.2 g (0.1 mol)), and MEK (71 g) at room temperature (about 20° C.) Then, AIBN (0.8 g (0.005 mol)) was added thereto, followed by degassing with stirring. Subsequently, the flask was purged with nitrogen gas, and the temperature inside the flask was raised to 80° C., followed by reaction for six hours. The reaction solution after the reaction was dropped into n-heptane (500 g), whereby a white precipitate was obtained. The precipitate was filtered and vacuum dried at 60° C., whereby a comparative fluororesin precursor 1 as a white solid was obtained (49.3 g; yield: 70%).

<Results of NMR Measurement>

The comparative fluororesin precursor 1 was analyzed by NMR. The ratio (molar ratio) of "Repeating units of comparative fluororesin precursor 1" below was as follows: HEMA repeating unit:MA-C6F repeating unit:MA-nBu repeating unit=35:32:33.

[Chem. 40]

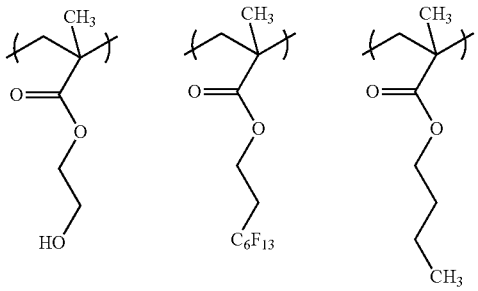

Repeating units of comparative fluororesin precursor 1

Repeating Units of Comparative Fluororesin Precursor 1
<Results of GPC Measurement>

The comparative fluororesin precursor 1 was measured by GPC. The results showed that Mw was 10,700 and Mw/Mn was 1.7.

Comparative Polymerization Example 2

The same procedure as the synthesis of the comparative fluororesin precursor 1 was performed, except that MA-nBu was replaced by p-AcO-St. Thus, a comparative fluororesin precursor 2 containing the following repeating units was obtained (yield: 74%).
<Results of NMR Measurement>

The comparative fluororesin precursor 2 was analyzed by NMR. The ratio (molar ratio) of "Repeating units of comparative fluororesin precursor 2" was as follows: HEMA repeating unit:MA-C6F repeating unit:p-AcO-St repeating unit=33:34:33.

[Chem. 41]

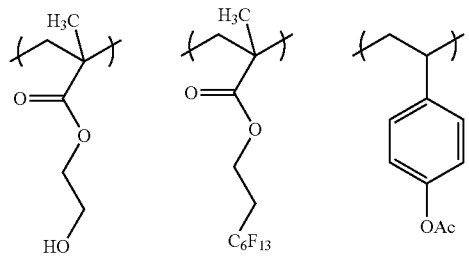

Repeating units of comparative fluororesin precursor 2

Repeating Units of Comparative Fluororesin Precursor 2
<Results of GPC Measurement>

The comparative fluororesin precursor 2 was measured by GPC. The results showed that Mw was 15,300 and Mw/Mn was 1.7.

Comparative Polymerization Example 3

The same procedure as the synthesis of the comparative fluororesin precursor 1 was performed, except that MA-nBu was replaced by p-HO-St. Thus, a comparative fluororesin precursor 3 containing the following repeating units was obtained (yield: 75%).
<Results of NMR Measurement>

The comparative fluororesin precursor 3 was analyzed by NMR. The ratio (molar ratio) of "Repeating units of comparative fluororesin precursor 3" was as follows: HEMA repeating unit:MA-C6F repeating unit:p-HO-St repeating unit=34:32:34.

[Chem. 42]

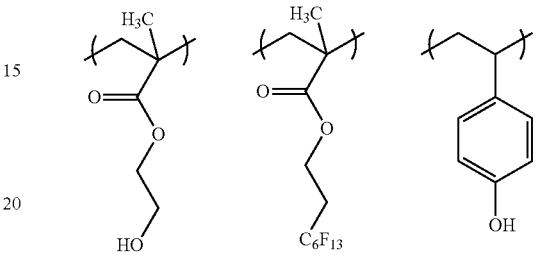

Repeating units of comparative fluororesin precursor 3

Repeating Units of Comparative Fluororesin Precursor 3
<Results of GPC Measurement>

The comparative fluororesin precursor 3 was measured by GPC. The results showed that Mw was 12,300 and Mw/Mn was 1.6.

Table 1 shows the repeating units of the resulting fluororesin precursor 1 to 6 and the comparative fluororesin precursors 1 to 3, molar ratio of the repeating units, and weight average molecular weight (Mw), molecular weight distribution (Mw/Mn), yield (%), and fluorine content (%) of each of the fluororesin precursors 1 to 6 and the comparative fluororesin precursors 1 to 3. The fluorine content (%) was determined by calculating the weight ratio of the repeating units from the molar ratio after polymerization of the monomers and calculating the weight percentage of fluorine atoms constituting the monomers.

TABLE 1

| Polymer | Monomer (repeating unit) (molar ratio) | | | | Molecular weight | | Yield (%) | Fluorine content (%) |
| --- | --- | --- | --- | --- | --- | --- | --- | --- |
| | 1 | 2 | 3 | 4 | Mw | Mw/Mn | | |
| Fluororesin precursor 1 | BTFBE 20 | HEMA 28 | MA-C6F 30 | p-HO-St 22 | 6,700 | 1.3 | 90 | 42 |
| Fluororesin precursor 2 | BTFBE 19 | HEMA 27 | MA-C6F 31 | VBA 23 | 6,900 | 1.3 | 91 | 41 |
| Fluororesin precursor 3 | BTFBE 15 | HEMA 33 | MA-C6F 30 | p-AcO-St 22 | 7,100 | 1.3 | 88 | 38.5 |
| Fluororesin precursor 4 | BTFBE 16 | HEMA 34 | MA-C6F 29 | St 21 | 7,400 | 1.3 | 90 | 40 |
| Fluororesin precursor 5 | — | HEMA 25 | MA-C6F 25 HFIP-M 24 | MAA 26 | 10,300 | 1.4 | 66 | 38 |
| Fluororesin precursor 6 | — | HEMA 33 | MA-C6F 32 | VBA 35 | 14,300 | 1.6 | 83 | 34 |
| Comparative fluororesin precursor 1 | — | HEMA 35 | MA-C6F 32 | MA-nBu 33 | 10,700 | 1.7 | 70 | 34 |
| Comparative fluororesin precursor 2 | — | HEMA 33 | MA-C6F 34 | p-AcO-St 33 | 15,300 | 1.7 | 74 | 34.5 |
| Comparative fluororesin precursor 3 | — | HEMA 34 | MA-C6F 32 | p-HO-St 34 | 12,300 | 1.6 | 75 | 36.5 |

3. Production of Fluororesin (Second Step: Addition Reaction)

The fluororesin precursors 1 to 6 and the comparative fluororesin precursors 1 to 3 obtained in "2. Production of fluororesin (first step: polymerization)" were each reacted with an acrylic acid derivative, whereby fluororesins were synthesized. The acrylic acid derivative was 2-isocyanato-ethyl acrylate (trade name: Karenz AOI, a product of Showa Denko K.K.) represented by the following formula. This reaction is an addition reaction of hydroxy groups of each fluororesin precursor and the acrylic acid derivative.

Described below are fluororesin synthesis examples. The resulting fluororesins were named as follows.

The first number represents the number of the fluororesin precursor. The subsequent alphabet letter represents the acrylic acid derivative used. Karenz AOI is represented by "A". The last number in the parenthesis indicates the nominal amount of acrylic acid derivative introduced (molar ratio) relative to the resin precursor.

crosslinking group). The newly formed bond ($W^2$ in the formula (4)) was "—O—C(=O)—NH—".

[Synthesis of Fluororesin 2-A (100) to 6-A (100) and Comparative Fluororesin 1-A (100) to 3-A (100)]

Fluororesins 2-A (100) to 6-A (100) and comparative fluororesins 1-A (100) to 3-A (100) were synthesized similarly to the fluororesin 1-A (100). Table 2 shows the fluororesin precursors used, formed bond ($W^2$ in the formula (4)), amount of acrylic acid derivative introduced (reaction rate %), amount of residual hydroxy groups (non-reaction rate %), weight average molecular weight (Mw), molecular weight distribution (Mw/Mn), and fluorine content (%).

TABLE 2

| | | | Ratio of acrylic acid derivative introduced (molar ratio) | | | | |
|---|---|---|---|---|---|---|---|
| Fluororesin No. | Fluororesin precursor No. | Formed bond ($W^2$ in formula (4)) | Amount of acrylic acid derivative introduced (reaction rate %) | Amount of residual hydroxy groups (non-reaction rate %) | Molecular weight Mw | Mw/Mn | Fluorine content (%) |
| 1-A (100) | 1 | —O—C(=O)—NH— | 99 | 1 | 8,200 | 1.3 | 36 |
| 2-A (100) | 2 | —O—C(=O)—NH— | 98 | 2 | 8,400 | 1.3 | 35 |
| 3-A (100) | 3 | —O—C(=O)—NH— | 99 | 1 | 8,600 | 1.3 | 32 |
| 4-A (100) | 4 | —O—C(=O)—NH— | 98 | 2 | 9,000 | 1.3 | 33 |
| 5-A (100) | 5 | —O—C(=O)—NH— | 98 | 2 | 12,100 | 1.4 | 34 |
| 6-A (100) | 6 | —O—C(=O)—NH— | 97 | 3 | 16,200 | 1.7 | 28 |
| Comparison 1-A (100) | Comparison 1 | —O—C(=O)—NH— | 98 | 2 | 12,600 | 1.8 | 28 |
| Comparison 2-A (100) | Comparison 2 | —O—C(=O)—NH— | 99 | 1 | 18,200 | 1.7 | 29 |
| Comparison 3-A (100) | Comparison 3 | —O—C(=O)—NH— | 98 | 2 | 14,300 | 1.7 | 31 |

[Chem. 43]

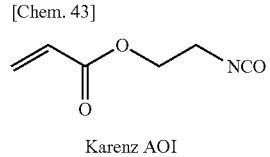

Karenz AOI

[Synthesis of Fluororesin 1-A (100)]

A 300-ml glass flask equipped with a stirrer was charged with the fluororesin precursor 1 (10 g (hydroxy equivalent: 0.0115 mol)) and PGMEA (30 g). Then, Karenz AOI (1.62 g (0.0114 mol)) was added thereto, and a reaction was carried out at 45° C. for eight hours. After completion of the reaction, the reaction solution was concentrated, and n-heptane (150 g) was then added to obtain a precipitate. The precipitate was filtered and vacuum dried at 35° C., whereby a fluororesin 1-A (100) as a white solid was obtained (11.1 g; yield: 95%).

<Results of NMR Measurement>

In the fluororesin 1-A (100), the molar ratio of the amount of Karenz AOI-derived acrylic acid derivative introduced (reaction rate) to the amount of residual hydroxy groups (non-reaction rate) was 99:1. The ratio of the repeating units (BTFBE repeating unit, MA-C6F repeating unit, and p-HO-St repeating unit) that do not react with a crosslinking group site was found to be unchanged from that in the fluororesin precursor 1 used (i.e., same as before the introduction of the 4. Evaluation of Low-Temperature Curing of Each Cured Fluororesin Film

[Formation of Photocurable Fluororesin Compositions 1 to 6 and Comparative Photocurable Fluororesin Compositions 1 to 3]

The fluororesins and comparative fluororesins produced (10 parts, each) were each mixed with a solvent (75 parts), a photopolymerization initiator (5 parts), and a crosslinking agent (10 parts), and the resulting solutions were filtered through a 0.2-μm membrane filter, whereby curable fluororesin compositions 1 to 6 and comparative curable fluororesin compositions 1 to 3 were prepared.

The following solvent, photopolymerization initiator, and crosslinking agent were used.
 Solvent: propylene glycol monomethyl ether acetate (PGMEA)
 Photopolymerization initiator: Irgacure 369 (available from BASF)
 Crosslinking agent: pentaerythritol tetraacrylate (available from Tokyo Chemical Industry Co., Ltd.)

[Formation of Fluororesin Films 1 to 6 and Comparative Fluororesin Films 1 to 3]

The curable fluororesin compositions 1 to 6 and comparative curable fluororesin compositions 1 to 3 prepared were each applied to a silicon wafer using a spin coater at a rotation speed of 1,000 rpm. Subsequently, each curable fluororesin composition was heated on a hot plate at 90° C. for 150 seconds to remove the solvent, whereby fluororesin films 1 to 6 and comparative fluororesin films 1 to 3 were each formed on the silicon wafer.

[Evaluation of Cured Fluororesin Film by Low-Temperature Curing Method]

The resulting resin films were each entirely exposed (200 mJ/cm²) to i-rays (wavelength: 365 nm) using a mask aligner (available from SUSS MicroTec Group) without a mask.

The films after exposure were subjected to comparison between a method (i) of forming a cured fluororesin film by curing at high temperatures (a method of heating at 230° C. for one hour) and the following methods (ii) to (iv) of forming a cured fluororesin film by curing at low temperatures.

(ii): Method of heating at 90° C. for one hour
(iii): Method of heating at 90° C. for one hour after the resin film is entirely exposed to i-rays (wavelength: 365 nm) for additional exposure (2000 mJ/cm$^2$) using the mask aligner without a mask
(iv): Method of heating at 90° C. for one hour after the resin film is entirely exposed to UV-ozone for five minutes using a UV-ozone treatment device (available from Sen Lights Corporation; model number: L17-110)

Each cured fluororesin film was evaluated for degree of curing by the degree of temporal change in contact angle with respect to anisole (a solvent for quantum dot color filters) at 1 second and 10 seconds after dropping of anisole.

After the thickness of the cured fluororesin film was measured in advance, a silicon substrate having the cured film on its surface was immersed in anisole in a petri dish and heated on a hot plate at 140° C. for 10 minutes. Subsequently, anisole on the surface of the cured film was sufficiently removed by an air gun, and the thickness was measured again. The cured film was evaluated by film thickness change before and after immersion in anisole.

The cured fluororesin film obtained by the method (i) of curing at high temperatures was used as reference. Cured fluororesin films with comparable evaluation results were determined as "good", and the rest were determined as "poor". Specifically, less temporal change in contact angle with respect to anisole is better, and less film thickness change after immersion in anisole is better.

[Contact Angle Measurement]

The contact angle of each cured fluororesin film surface and each comparative cured fluororesin film surface with respect to methyl benzoate was measured using a contact angle meter "DMs-601" available from Kyowa Interface Science Co., Ltd.

[Film Thickness Measurement]

Using a stylus-type surface shape measuring instrument "Dektak-8" available from Bruker Nano, the thickness of each cured fluororesin film and the thickness of each comparative cured fluororesin film were measured before and after immersion in anisole.

Table 3 shows the results.

According to the results, the cured fluororesin films 1 to 6 formed by the method (iv) were comparable to those of the cured fluororesin films obtained by the method (i) (reference). This confirmed sufficient curing even at low temperatures.

Regarding the cured fluororesin films formed by the methods (ii) and (iii), the cured fluororesin films 2, 5, and 6 showed good results.

In contrast, the comparative cured fluororesin films 1 to 3 were defective with a significant temporal decrease in contact angle with respect to anisole and a significant decrease in film thickness after immersion in anisole, as compared to the cured fluororesin films formed by the method (i) (reference). Anisole after being used for immersion was concentrated by an evaporator and the resulting oily matter was analyzed, with the result that each fluororesin was detected. This confirmed that these fluororesins were dissolved in anisole due to insufficient curing.

5. Preparation of Photosensitive Resin Composition

[Preparation of Photosensitive Resin Compositions 1 to 10 and Comparative Photosensitive Resin Compositions 1 to 6]

The fluororesins or comparative fluororesins produced above, solvents, photopolymerization initiators, crosslinking agents, and alkali-soluble resins were blended according to Table 4. The resulting solutions were filtered through a 0.2-μm membrane filter, whereby photosensitive resin compositions 1 to 10 and comparative photosensitive resin compositions 1 to 6 were prepared.

The following solvents, photopolymerization initiators, crosslinking agents, and alkali-soluble resins were used.

Solvents:
  S-1: propylene glycol monomethyl ether acetate (PGMEA)
  S-2: γ-butyrolactone
  S-3: propylene glycol monomethyl ether (PGME)
  S-4: methyl ethyl ketone
  S-5: ethyl lactate
Photopolymerization Initiators:
  Ini-1: 4-benzoyibenzoic acid
  Ini-2: Irgacure 651 (available from BASF)
  Ini-3: Irgacure 369 (available from BASF)
Crosslinking Agents:
  CL-1: pentaerythritol tetraacrylate (available from Tokyo Chemical Industry Co., Ltd.)
  CL-2: A-TMM-3 (available from Shin-Nakamura Chemical Co., Ltd.)
Alkali-soluble Resins:
  ASP-1: CCR-1235 (available from Nippon Kayaku Co., Ltd.)
  ASP-2: ZCR-1569H (available from Nippon Kayaku Co., Ltd.)

TABLE 3

| Cured fluororesin film | (i) (Reference Example) | | | | (ii) | | | | (iii) | | | | (iv) | | | |
|---|---|---|---|---|---|---|---|---|---|---|---|---|---|---|---|---|
| | Contact angle (°) | | Film thickness (nm) | | Contact angle (°) | | Film thickness (nm) | | Contact angle (°) | | Film thickness (nm) | | Contact angle (°) | | Film thickness (nm) | |
| | 1 s | 10 s | Before | After | 1 s | 10 s | Before | After | 1 s | 10 s | Before | After | 1 s | 10 s | Before | After |
| 1 | 61.0 | 60.8 | 1210 | 1210 | 61.0 | 48.5 | 1230 | 870 | 60.5 | 47.8 | 1200 | 810 | 61.2 | 61.2 | 1250 | 1250 |
| 2 | 70.0 | 69.8 | 1190 | 1190 | 65.0 | 64.5 | 1210 | 1200 | 66.0 | 65.6 | 1190 | 1190 | 70.1 | 69.8 | 1230 | 1220 |
| 3 | 66.1 | 65.8 | 1200 | 1200 | 57.0 | 38.0 | 1230 | 840 | 57.0 | 38.0 | 1250 | 830 | 66.0 | 65.9 | 1180 | 1170 |
| 4 | 66.2 | 66.0 | 1230 | 1220 | 63.1 | 42.7 | 1250 | 650 | 64.5 | 41.7 | 1230 | 650 | 67.2 | 67.0 | 1200 | 1190 |
| 5 | 60.1 | 59.9 | 1180 | 1170 | 65.0 | 63.5 | 1270 | 1250 | 64.2 | 63.6 | 1230 | 1230 | 60.0 | 59.8 | 1230 | 1230 |
| 6 | 67.1 | 67.0 | 1160 | 1160 | 63.1 | 62.3 | 1250 | 1240 | 63.5 | 62.8 | 1200 | 1190 | 66.3 | 66.3 | 1180 | 1170 |
| Comparison 1 | 61.3 | 61.0 | 1180 | 1170 | 65.0 | 34.3 | 1160 | 320 | 63.2 | 33.1 | 1230 | 300 | 35.2 | 20.2 | 1050 | 320 |
| Comparison 2 | 64.5 | 63.8 | 1190 | 1180 | 67.2 | 43.1 | 1150 | 410 | 65.2 | 41.8 | 1210 | 420 | 32.1 | 18.6 | 1080 | 380 |
| Comparison 3 | 62.5 | 62.1 | 1160 | 1160 | 68.1 | 45.3 | 1190 | 330 | 67.2 | 45.4 | 1190 | 350 | 28.3 | 13.9 | 1120 | 280 |

TABLE 4

| Photosensitive resin composition No. | Fluororesin Type | Fluororesin Parts by mass | Solvent Type | Solvent Parts by mass | Photopolymerization initiator Type | Photopolymerization initiator Parts by mass | Crosslinking agent Type | Crosslinking agent Parts by mass | Alkali-soluble resin Type | Alkali-soluble resin Parts by mass |
|---|---|---|---|---|---|---|---|---|---|---|
| 1 | 1-A (100) | 1.0 | S-1 / S-3 | 70 / 30 | Ini-2 | 1.5 | CL-1 | 10 | ASP-1 | 10 |
| 2 | 1-A (100) | 1.0 | S-1 / S-2 | 70 / 30 | Ini-2 | 1.5 | CL-2 | 10 | ASP-2 | 10 |
| 3 | 2-A (100) | 1.0 | S-1 / S-3 | 65 / 35 | Ini-1 | 1.5 | CL-1 | 10 | ASP-1 | 10 |
| 4 | 2-A (100) | 1.0 | S-1 / S-4 | 65 / 35 | Ini-2 | 1.5 | CL-2 | 10 | ASP-2 | 10 |
| 5 | 3-A (100) | 1.0 | S-1 / S-3 | 70 / 30 | Ini-2 | 1.5 | CL-1 | 10 | ASP-1 | 10 |
| 6 | 3-A (100) | 1.0 | S-1 / S-5 | 65 / 35 | Ini-3 | 1.5 | CL-2 | 10 | ASP-2 | 10 |
| 7 | 4-A (100) | 1.0 | S-1 / S-3 | 65 / 35 | Ini-2 | 1.5 | CL-1 | 10 | ASP-1 | 10 |
| 8 | 4-A (100) | 1.0 | S-3 / S-5 | 70 / 30 | Ini-3 | 1.5 | CL-2 | 10 | ASP-2 | 10 |
| 9 | 5-A (100) | 1.0 | S-1 / S-3 | 65 / 35 | Ini-2 | 1.5 | CL-1 | 10 | ASP-2 | 10 |
| 10 | 6-A (100) | 1.0 | S-1 / S-3 | 70 / 30 | Ini-2 | 1.5 | CL-2 | 10 | ASP-2 | 10 |
| Comparison 1 | Comparison 1-A (100) | 1.0 | S-1 / S-3 | 70 / 30 | Ini-2 | 1.5 | CL-1 | 10 | ASP-1 | 10 |
| Comparison 2 | Comparison 1-A (100) | 1.0 | S-1 / S-3 | 55 / 45 | Ini-3 | 1.5 | CL-2 | 10 | ASP-2 | 10 |
| Comparison 3 | Comparison 2-A (100) | 1.0 | S-1 / S-3 | 70 / 30 | Ini-3 | 1.5 | CL-1 | 10 | ASP-1 | 10 |
| Comparison 4 | Comparison 2-A (100) | 1.0 | S-1 / S-3 | 60 / 40 | Ini-1 | 1.5 | CL-1 | 10 | ASP-2 | 10 |
| Comparison 5 | Comparison 3-A (100) | 1.0 | S-1 / S-3 | 65 / 35 | Ini-2 | 1.5 | CL-1 | 10 | ASP-1 | 10 |
| Comparison 6 | Comparison 3-A (100) | 1.0 | S-1 / S-3 | 60 / 40 | Ini-2 | 1.5 | CL-1 | 10 | ASP-1 | 10 |

6. Evaluation of Low-Temperature Curing of Each Photosensitive Resin Composition The photosensitive resin compositions 1 to 10 and the comparative photosensitive resin compositions 1 to 6 prepared in "5. Preparation of photosensitive resin compositions" were each applied to a silicon wafer using a spin coater at a rotation speed of 1,000 rpm as in "4. Evaluation of low-temperature curing of each fluororesin film". Subsequently, these resin compositions were heated on a hot plate at 90° C. for 150 seconds, whereby photosensitive resin films 1 to 0 and comparative photosensitive resin films 1 to 6 (the numbers correspond to the respective numbers of the photosensitive resin compositions) were each formed on the silicon wafer.

[Evaluation of Cured Fluororesin Film by Low-Temperature Curing Method]

The resulting resin films were each entirely exposed (200 mJ/cm$^2$) to i-rays (wavelength: 365 nm) using the mask aligner without a mask.

The films after exposure were subjected to comparison between cured fluororesin films formed by the method (i) and cured fluororesin films formed by the methods (ii) to (iv) as in "4. Evaluation of low-temperature curing of each fluororesin film".

Evaluation of each cured fluororesin film (degree of curing) is the same as "4. Evaluation of low-temperature curing of each fluororesin film".

Table 5 shows the results.

TABLE 5

| Photosensitive resin composition | (i) (Reference Example) Contact angle (°) 1 s | (i) 10 s | (i) Film thickness (nm) Before | (i) After | (ii) Contact angle (°) 1 s | (ii) 10 s | (ii) Film thickness (nm) Before | (ii) After | (iii) Contact angle (°) 1 s | (iii) 10 s | (iii) Film thickness (nm) Before | (iii) After | (iv) Contact angle (°) 1 s | (iv) 10 s | (iv) Film thickness (nm) Before | (iv) After |
|---|---|---|---|---|---|---|---|---|---|---|---|---|---|---|---|---|
| 1 | 55 | 55 | 5300 | 5300 | 54 | 46 | 5200 | 4200 | 55 | 45 | 5300 | 4150 | 56 | 56 | 5200 | 5200 |
| 2 | 58 | 58 | 5200 | 5200 | 55 | 45 | 5250 | 4300 | 57 | 46 | 5200 | 4250 | 57 | 57 | 5250 | 5250 |
| 3 | 59 | 59 | 5250 | 5250 | 56 | 55 | 5100 | 5050 | 56 | 56 | 5250 | 5200 | 60 | 60 | 5100 | 5100 |
| 4 | 57 | 57 | 5100 | 5100 | 55 | 54 | 5150 | 5050 | 56 | 55 | 5100 | 5050 | 58 | 58 | 5150 | 5150 |
| 5 | 56 | 56 | 5150 | 5150 | 56 | 42 | 5300 | 3900 | 55 | 41 | 5150 | 4000 | 55 | 55 | 5300 | 5300 |
| 6 | 58 | 58 | 5100 | 5100 | 55 | 43 | 5200 | 4100 | 54 | 42 | 5100 | 4050 | 59 | 59 | 5200 | 5200 |
| 7 | 56 | 56 | 5200 | 5200 | 53 | 39 | 5100 | 3950 | 54 | 40 | 5200 | 4100 | 57 | 57 | 5100 | 5100 |
| 8 | 60 | 60 | 5250 | 5250 | 55 | 41 | 5250 | 4050 | 53 | 40 | 5250 | 3950 | 58 | 58 | 5250 | 5200 |
| 9 | 54 | 54 | 5100 | 5100 | 53 | 52 | 5000 | 4950 | 53 | 53 | 5100 | 5000 | 47 | 32 | 5000 | 4700 |

TABLE 5-continued

| | Curing method | | | | | | | | | | | | | | | |
|---|---|---|---|---|---|---|---|---|---|---|---|---|---|---|---|---|
| | (i) (Reference Example) | | | | (ii) | | | | (iii) | | | | (iv) | | | |
| Photosensitive resin | Contact angle (°) | | Film thickness (nm) | | Contact angle (°) | | Film thickness (nm) | | Contact angle (°) | | Film thickness (nm) | | Contact angle (°) | | Film thickness (nm) | |
| composition | 1 s | 10 s | Before | After | 1 s | 10 s | Before | After | 1 s | 10 s | Before | After | 1 s | 10 s | Before | After |
| 10 | 56 | 56 | 5200 | 5200 | 54 | 53 | 5050 | 4900 | 55 | 54 | 5200 | 5150 | 49 | 36 | 5050 | 4550 |
| Comparison 1 | 55 | 55 | 5150 | 5150 | 54 | 32 | 5100 | 3900 | 54 | 29 | 5150 | 3800 | 35 | 21 | 5100 | 3500 |
| Comparison 2 | 54 | 54 | 5150 | 5150 | 53 | 33 | 5200 | 3800 | 54 | 30 | 5150 | 3750 | 31 | 19 | 5200 | 3300 |
| Comparison 3 | 55 | 55 | 5200 | 5200 | 55 | 43 | 5100 | 4100 | 53 | 40 | 5200 | 4050 | 30 | 15 | 5100 | 3600 |
| Comparison 4 | 55 | 55 | 5050 | 5050 | 54 | 42 | 5000 | 4050 | 55 | 41 | 5050 | 4100 | 27 | 20 | 5000 | 3500 |
| Comparison 5 | 56 | 56 | 5300 | 5300 | 56 | 39 | 5200 | 3500 | 54 | 38 | 5300 | 3600 | 33 | 18 | 5200 | 3250 |
| Comparison 6 | 53 | 53 | 5200 | 5200 | 54 | 39 | 5100 | 3600 | 54 | 37 | 5200 | 3650 | 28 | 14 | 5100 | 3600 |

Curing the photosensitive resins 1 to 8 by the method (iv) yielded results equivalent to those of the reference examples obtained by curing by the method (i), resulting in good cured films.

In contrast, curing the comparative photocurable fluororesins 1 to 3 by the method (iv) yielded poor results as compared to curing by the method (i). Curing the photosensitive resins 1 to 8 by the method (ii) or (iii) yielded good results among the photosensitive resins 3, 4, 9, and 10.

7. Evaluation of Banks

The photosensitive resin compositions 1 to 10 and the comparative photosensitive resin compositions 1 to 6 obtained in "5. Preparation of photosensitive resin compositions" were used to form banks 1 to 10 and comparative banks 1 to 6, respectively, by the following method, and the bank properties were evaluated and compared.

[Formation of Banks]

A 10-cm square ITO substrate was washed with ultrapure water and then acetone. Subsequently, the substrate was subjected to UV-ozone treatment for five minutes using the UV-ozone treatment described above. Then, the photosensitive resin compositions 1 to 10 and the comparative photosensitive resin compositions 1 to 6 obtained in "5. Preparation of photosensitive resin compositions" were each applied to the UV-ozone-treated substrate using a spin coater at a rotation speed of 1,000 rpm, followed by heating on a hot plate at 90° C. for 150 seconds. Thus, fluororesin films and comparative fluororesin films each having a thickness of 5 μm were formed. Each resulting resin film was exposed to i-rays (wavelength: 365 nm) using a mask aligner (available from SUSS MicroTec Group) with a mask having a 5-μm line-and-space pattern. The resulting film was immersed in an alkali developer for 80 seconds, and then washed with ultrapure water for 60 seconds. Subsequently, the resulting patterned film was heated at 90° C. for one hour (baking) and subjected to UV-ozone treatment for five minutes, followed by heating at 90° C. for one hour.

The resulting resin film was subjected to evaluation of solubility in the developer during the step, evaluation of bank properties (sensitivity and resolution), and contact angle measurement.

[Solubility in Developer]

The resin film on the ITO substrate after exposure was immersed in an alkali developer at room temperature for 80 seconds to evaluate the solubility in the alkali developer. The alkali developer was a 2.38 mass % tetramethylammonium hydroxide aqueous solution (hereinafter sometimes referred to as TMAH). The solubility of the banks was evaluated by measuring the thickness of the banks after immersion using a contact film thickness meter. The banks were evaluated as "soluble" when completely dissolved, and "insoluble" when the resist film remained undissolved.

Table 6 shows the results.

[Bank Properties (Sensitivity and Resolution)]

The optimal exposure Eop (mJ/cm$^2$) for forming banks arranged in the line-and-space pattern was determined and used as an index for sensitivity.

The resulting pattern of banks was observed under a microscope to evaluate the resolution. A pattern without visible line-edge roughness was evaluated as "excellent"; a pattern with slightly visible line-edge roughness was evaluated as "good"; and a pattern with significant line-edge roughness was evaluated as "poor".

Table 6 shows the results.

[Contact Angle]

For the entire substrate surface having the banks obtained in the above step, the contact angle between the bank or comparative bank surface and anisole was measured. For the rest of the film, the exposed portions with little temporal change in contact angle were considered as good, and the non-exposed portions with a low contact angle were considered as good.

Table 6 shows the results.

TABLE 6

| | | Bank | | | | | | | |
|---|---|---|---|---|---|---|---|---|---|
| | | 1 | 2 | 3 | 4 | 5 | 6 | 7 | 8 |
| | | Photosensitive resin composition | | | | | | | |
| | | 1 | 2 | 3 | 4 | 5 | 6 | 7 | 8 |
| Solubility in developer | Non-exposed portion | Soluble | Soluble | Soluble | Soluble | Soluble | Soluble | Soluble | Soluble |
| | Exposed portion | Insoluble | Insoluble | Insoluble | Insoluble | Insoluble | insoluble | Insoluble | Insoluble |
| Bank performance | Sensitivity (mJ/cm$^2$) | 200 | 205 | 202 | 206 | 205 | 200 | 199 | 210 |
| | Resolution | Excellent | Excellent | Excellent | Excellent | Excellent | Excellent | Excellent | Excellent |

TABLE 6-continued

| | | | | | | | | | |
|---|---|---|---|---|---|---|---|---|---|
| Contact angle (°) | 1 s | 10 | 10 | 10 | 10 | 10 | 10 | 10 | 10 |
| Non-exposed portion | 10 s | 10 | 10 | 10 | 10 | 10 | 10 | 10 | 10 |
| Contact angle (°) | 1 s | 56 | 57 | 60 | 58 | 55 | 59 | 57 | 58 |
| Exposed portion | 10 s | 56 | 57 | 60 | 58 | 55 | 59 | 57 | 58 |

| | | Bank | | | | | | | |
|---|---|---|---|---|---|---|---|---|---|
| | | 9 | 10 | Comparison 1 | Comparison 2 | Comparison 3 | Comparison 4 | Comparison 5 | Comparison 6 |
| | | | | Photosensitive resin composition | | | | | |
| | | 9 | 10 | Comparison 1 | Comparison 2 | Comparison 3 | Comparison 4 | Comparison 5 | Comparison 6 |
| Solubility in developer | Non-exposed portion | Soluble | Soluble | Soluble | Soluble | Soluble | Soluble | Soluble | Soluble |
| | Exposed portion | Insoluble | Insoluble | Insoluble | Insoluble | Insoluble | Insoluble | Insoluble | Insoluble |
| Bank performance | Sensitivity (mJ/cm$^2$) | 200 | 210 | 205 | 210 | 200 | 204 | 205 | 205 |
| | Resolution | Excellent | Excellent | Excellent | Excellent | Excellent | Excellent | Excellent | Excellent |
| Contact angle (°) | 1 s | 10 | 10 | 10 | 10 | 10 | 10 | 10 | 10 |
| Non-exposed portion | 10 s | 10 | 10 | 10 | 10 | 10 | 10 | 10 | 10 |
| Contact angle (°) | 1 s | 47 | 49 | 35 | 31 | 30 | 27 | 33 | 28 |
| Exposed portion | 10 s | 32 | 36 | 21 | 19 | 15 | 20 | 18 | 14 |

The evaluation of solubility in the developer shows that the banks or comparative banks were made of a negative resist in which only the non-exposed portions are soluble. The evaluation of the bank properties shows that the banks and comparative banks had comparable sensitivity and "excellent" resolution in which the 5-μm line-and-space pattern of the mask was transferred with good resolution without visible line-edge roughness. Specifically, these evaluations show that the fluororesins of the present disclosure and the comparative fluororesins only slightly influenced the banks.

In contrast, regarding the banks, the films heated at 90° C. after the UV-ozone treatment showed no temporal change in contact angle with respect to anisole, with sufficient curing even at low temperatures, resulting in good banks with high liquid repellency.

Example 1

A light-emitting element was produced by the following procedure, using the photosensitive resin composition 1 prepared in "5. Preparation of photosensitive resin composition".
(Preparing Base Element)
A base substrate made of an ITO-coated glass substrate was provided a blue organic EL light-emitting element as a first light emitting layer was disposed thereon, whereby a base element was prepared.
(Forming a Patterned Fluororesin Film)
(a) Forming a Film
The photosensitive resin composition 1 was applied to the first light emitting layer of the base element to partition a region of the first light emitting layer. The composition was applied by slit coating.
Next, the photosensitive resin composition was heated at 90° C. for 120 seconds, whereby the photosensitive resin composition 1 was obtained as a fluororesin film.
(b) Exposing
A photo mask was set in an exposure device, and the fluororesin film was exposed to I-rays through the photo mask.
The amount of exposure was 100 mJ/cm$^2$.
(c) Developing
Next, the fluororesin film after the exposing was developed into a patterned fluororesin film by spraying using a 0.04 mass % potassium hydroxide aqueous solution.

The development time was one minute.
(Baking)
Then, the resulting patterned fluororesin film was cured into banks by baking at 90° C.
The baking time was 60 minutes.
(Forming a Second Light Emitting Layer)
Next, a second light emitting layer made of a red quantum dot wavelength conversion material was disposed inside the banks.
A light-emitting element according to Example 1 was produced by the above steps.

(Example 2), (Example 3), and (Comparative Example 1)

Light-emitting elements according to Example 2, Example 3, and Comparative Example 1 were produced as in Example 1, except that the baking temperature in the baking was varied as shown in Table 7.
(Light-Emitting Performance Evaluation Test)
The emission intensity of the red light-emitting element of the light-emitting element described in each of the examples and comparative examples was measured and compared relative to the emission intensity of the light-emitting element according to Example 1 taken as 100. Table 7 shows the results.

TABLE 7

| | Example 1 | Example 2 | Example 3 | Comparative Example 1 |
|---|---|---|---|---|
| Baking temperature (° C.) | 90 | 140 | 200 | 230 |
| Emission intensity | 100 | 95 | 85 | 60 |

As clearly shown in Table 7, the light-emitting elements according to Examples 1 and 2 in which the patterned fluororesin films were formed by baking at a temperature of 200° C. or lower showed a higher emission intensity than the light-emitting elements according to Comparative Examples 1 and 2 in which the patterned fluororesin films were formed by baking at a higher temperature.

The invention claimed is:

1. A method of producing a light-emitting element, comprising:
preparing a base element including a monochromatic first light emitting layer on a substrate;
forming a patterned fluororesin film by disposing a photosensitive resin composition at least containing a fluororesin having a crosslinking site and a repeating unit derived from a hydrocarbon containing a fluorine atom, a solvent, and a photopolymerization initiator on the base element such that the photosensitive resin composition partitions at least one region of the base element; and
baking the patterned fluororesin film at a temperature of 100° C. or lower to cure the patterned fluororesin film, wherein the fluororesin has a structure represented by the following formula (3) and/or formula (4), and has a fluorine content of 25 to 45 mass %:

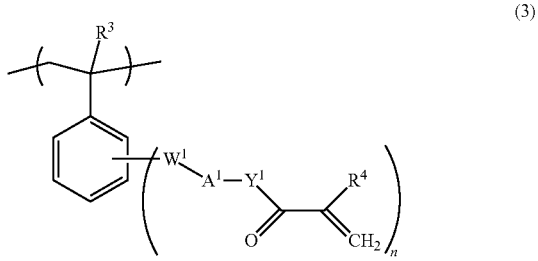
(3)

wherein $R^3$ and $R^4$ each independently represent a hydrogen atom or a methyl group; $W^1$ is a divalent linking group and represents —O—, —O—C(=O)—, —C(=O)—O—, —O—C(=O)—NH—, —C(=O)—O—C(=O)—NH—, or —C(=O)—NH—; $A^1$ is a divalent linking group and represents a C1-C10 linear, C3-C10 branched, or C3-C10 cyclic alkylene group in which one or more hydrogen atoms in the alkylene group may be substituted by hydroxy groups or —O—C(=O)—CH$_3$; $Y^1$ is a divalent linking group and represents —O— or —NH—; and n represents an integer of 1 to 3;

[Chem. 12]

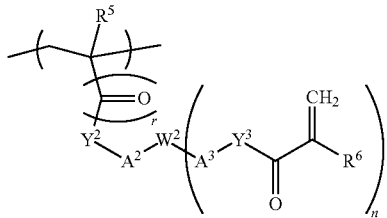

wherein $R^5$ and $R^6$ each independently represent a hydrogen atom or a methyl group; $W^2$ is a divalent linking group and represents —O—, —O—C(=O)—, —C(=O)—O—, —O—C(=O)—NH—, —C(=O)—O—C(=O)—NH—, or —C(=O)—NH—; $A^2$ and $A^3$ are divalent linking groups and each independently represent a C1-C10 linear, C3-C10 branched, or C3-C10 cyclic alkylene group in which one or more hydrogen atoms in the alkylene group may be substituted by hydroxy groups or —O—C(=O)—CH$_3$; $Y^2$ and $Y^3$ are divalent linking groups and each independently represent —O— or —NH—; n represents an integer of 1 to 3; and r represents 0 or 1;

wherein the repeating unit derived from a hydrocarbon containing a fluorine atom has a structure represented by the following formula (1):

[Chem. 1]

—CR²=CRf₂ (1)

wherein each Rf independently represents a C1-C6 linear, C3-C6 branched, or C3-C6 cyclic perfluoroalkyl group or a fluorine atom; and $R^2$ represents a hydrogen atom or a C1-C6 linear, C3-C6 branched, or C3-C6 cyclic alkyl group.

2. The method of producing a light-emitting element according to claim 1, further comprising forming a second light emitting layer that emits light using light from the first light emitting layer as excitation light in the region partitioned by the patterned fluororesin film.

3. The method of producing a light-emitting element according to claim 1,
wherein the repeating unit derived from a hydrocarbon containing a fluorine atom has a structure represented by the following formula (2);

[Chem. 2]

(2)

wherein each Rf independently represents a C1-C6 linear, C3-C6 branched, or C3-C6 cyclic perfluoroalkyl group or a fluorine atom; $R^1$ represents a hydrogen atom, a fluorine atom, or a methyl group; and $R^2$ represents a hydrogen atom or a C1-C6 linear, C3-C6 branched, or C3-C6 cyclic alkyl group.

4. The method of producing a light-emitting element according to claim 1,
wherein in the formula (1), each Rf is a fluorine atom, a trifluoromethyl group, a difluoromethyl group, a pentafluoroethyl group, a 2,2,2-trifluoroethyl group, an n-heptafluoropropyl group, a 2,2,3,3,3-pentafluoropropyl group, a 3,3,3-trifluoropropyl group, a hexafluoroisopropyl group, a heptafluoroisopropyl group, an n-nonafluorobutyl group, an isononafluorobutyl group, or a tert-nonafluorobutyl group.

5. The method of producing a light-emitting element according to claim 1,
wherein the photosensitive resin composition further contains a crosslinking agent.

6. The method of producing a light-emitting element according to claim 1,
wherein the photosensitive resin composition further contains an alkali-soluble resin.

7. The method of producing a light-emitting element according to claim 1,
wherein the photosensitive resin composition further contains a colorant.

8. The method of producing a light-emitting element according to claim 1, further comprising, after the forming of the patterned fluororesin film, exposing the patterned fluororesin film to high energy rays.

9. The method of producing a light-emitting element according to claim 8,
   wherein the high energy rays are at least one type of rays selected from the group consisting of ultraviolet rays, gamma rays, X-rays, and a-rays.

10. The method of producing a light-emitting element according to claim 1,
    wherein the light-emitting element is a light-emitting element for quantum dot display.

11. The method of producing a light-emitting element according to claim 3,
    wherein in the formula (2), each Rf is a fluorine atom, a trifluoromethyl group, a difluoromethyl group, a pentafluoroethyl group, a 2,2,2-trifluoroethyl group, an n-heptafluoropropyl group, a 2,2,3,3,3-pentafluoropropyl group, a 3,3,3-trifluoropropyl group, a hexafluoroisopropyl group, a heptafluoroisopropyl group, an n-nonafluorobutyl group, an isononafluorobutyl group, or a tert-nonafluorobutyl group.

\* \* \* \* \*